US008445365B2

(12) United States Patent
Im et al.

(10) Patent No.: US 8,445,365 B2
(45) Date of Patent: May 21, 2013

(54) SINGLE SCAN IRRADIATION FOR CRYSTALLIZATION OF THIN FILMS

(75) Inventors: James S. Im, New York, NY (US); Paul C. Van Der Wilt, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 43 days.

(21) Appl. No.: 13/165,369

(22) Filed: Jun. 21, 2011

(65) Prior Publication Data
US 2011/0248278 A1   Oct. 13, 2011

Related U.S. Application Data

(62) Division of application No. 11/876,974, filed on Oct. 23, 2007, now Pat. No. 7,964,480, which is a division of application No. 10/944,350, filed on Sep. 17, 2004, now Pat. No. 7,311,778.

(60) Provisional application No. 60/504,270, filed on Sep. 19, 2003.

(51) Int. Cl.
*H01L 21/00* (2006.01)

(52) U.S. Cl.
USPC .............................. 438/486; 438/487; 438/488

(58) Field of Classification Search
USPC .......................................... 438/486, 487, 488
See application file for complete search history.

(56) References Cited

U.S. PATENT DOCUMENTS

| 3,632,205 A | 1/1972 | Marcy et al. |
|---|---|---|
| 4,234,358 A | 11/1980 | Celler et al. |
| 4,309,225 A | 1/1982 | Fan et al. |
| 4,382,658 A | 5/1983 | Shields et al. |

(Continued)

FOREIGN PATENT DOCUMENTS

| CN | 1495848 A | 5/2004 |
|---|---|---|
| CN | 101111925 A | 1/2008 |

(Continued)

OTHER PUBLICATIONS

Bergmann, R. et al., "Nucleation and Growth of Crystalline Silicon Films on Glass for Solar Cells," Phys. Stat. Sol., 1998, pp. 587-602, vol. 166, Germany.

(Continued)

*Primary Examiner* — Laura Menz
(74) *Attorney, Agent, or Firm* — Wilmer Cutler Pickering Hale and Dorr LLP

(57) ABSTRACT

A method of processing a polycrystalline film on a substrate includes generating laser pulses, directing the laser pulses through a mask to generate patterned laser beams, each having a length l', a width w', and a spacing between adjacent beams d'; irradiating a region of the film with the patterned beams, said beams having an intensity sufficient to melt and to induce crystallization of the irradiated portion of the film, wherein the film region is irradiated n times; and after irradiation of each film portion, translating the film and/or the mask, in the x- and y-directions. The distance of translation in the y-direction is about $l'/n-\delta$, where $\delta$ is a value selected to overlap the beamlets from one irradiation step to the next. The distance of translation in the x-direction is selected such that the film is moved a distance of about $\lambda'$ after n irradiations, where $\lambda'=w'+d'$.

15 Claims, 21 Drawing Sheets

U.S. PATENT DOCUMENTS

| | | | |
|---|---|---|---|
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai et al. | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| 5,076,667 A | 12/1991 | Stewart | |
| RE33,836 E | 3/1992 | Resor, III et al. | |
| 5,145,808 A | 9/1992 | Sameshima et al. | |
| 5,173,441 A | 12/1992 | Yu et al. | |
| 5,204,659 A | 4/1993 | Sarma | |
| 5,233,207 A | 8/1993 | Anzai et al. | |
| 5,247,375 A | 9/1993 | Mochizuki | |
| 5,281,840 A | 1/1994 | Sarma | |
| 5,285,236 A | 2/1994 | Jain | |
| 5,291,240 A | 3/1994 | Jain | |
| 5,294,811 A | 3/1994 | Aoyama et al. | |
| 5,304,357 A | 4/1994 | Sato et al. | |
| 5,338,959 A | 8/1994 | Kim et al. | |
| 5,373,803 A | 12/1994 | Noguchi et al. | |
| 5,395,481 A | 3/1995 | McCarthy | |
| 5,409,867 A | 4/1995 | Asano et al. | |
| 5,453,594 A | 9/1995 | Konecny | |
| 5,456,763 A | 10/1995 | Kaschmitter et al. | |
| 5,496,768 A | 3/1996 | Kudo et al. | |
| 5,512,494 A | 4/1996 | Tanabe et al. | |
| 5,523,193 A | 6/1996 | Nelson | |
| 5,529,951 A | 6/1996 | Noguchi et al. | |
| 5,571,430 A | 11/1996 | Kawasaki et al. | |
| 5,591,668 A | 1/1997 | Maegawa et al. | |
| 5,663,579 A | 9/1997 | Noguchi | |
| 5,683,935 A | 11/1997 | Miyamoto | |
| 5,710,050 A | 1/1998 | Makita et al. | |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,767,003 A | 6/1998 | Noguchi | |
| 5,817,548 A | 10/1998 | Noguchi et al. | |
| 5,844,588 A | 12/1998 | Anderson | |
| 5,858,807 A | 1/1999 | Kawamura | |
| 5,861,991 A | 1/1999 | Fork | |
| 5,893,990 A | 4/1999 | Tanaka et al. | |
| 5,948,291 A | 9/1999 | Neylan et al. | |
| 5,960,323 A | 9/1999 | Wakita et al. | |
| 5,986,807 A | 11/1999 | Fork | |
| 6,002,523 A | 12/1999 | Tanaka | |
| 6,014,944 A | 1/2000 | Aklufi et al. | |
| 6,020,224 A | 2/2000 | Shimogaichi et al. | |
| 6,020,244 A | 2/2000 | Thompson et al. | |
| 6,045,980 A | 4/2000 | Edelkind et al. | |
| 6,072,631 A | 6/2000 | Guenther et al. | |
| 6,081,381 A | 6/2000 | Shalapenok et al. | |
| 6,117,752 A | 9/2000 | Suzuki et al. | |
| 6,120,976 A | 9/2000 | Treadwell et al. | |
| 6,130,009 A | 10/2000 | Smith et al. | |
| 6,130,455 A | 10/2000 | Yoshinouchi et al. | |
| 6,135,632 A | 10/2000 | Flint | |
| 6,136,632 A | 10/2000 | Higashi | |
| 6,156,997 A | 12/2000 | Yamazaki et al. | |
| 6,162,711 A | 12/2000 | Ma et al. | |
| 6,169,014 B1 | 1/2001 | McCulloch et al. | |
| 6,172,820 B1 | 1/2001 | Kuwahara et al. | |
| 6,176,922 B1 * | 1/2001 | Aklufi et al. | 117/4 |
| 6,177,301 B1 | 1/2001 | Jung et al. | |
| 6,184,490 B1 | 2/2001 | Schweizer | |
| 6,187,088 B1 | 2/2001 | Okumura et al. | |
| 6,190,985 B1 | 2/2001 | Buynoski | |
| 6,193,796 B1 | 2/2001 | Yang et al. | |
| 6,203,952 B1 | 3/2001 | O'Brien et al. | |
| 6,235,614 B1 | 5/2001 | Yang et al. | |
| 6,242,291 B1 | 6/2001 | Kusumoto et al. | |
| 6,274,488 B1 | 8/2001 | Talwar et al. | |
| 6,285,001 B1 | 9/2001 | Fleming et al. | |
| 6,300,175 B1 | 10/2001 | Moon et al. | |
| 6,313,435 B1 | 11/2001 | Shoemaker et al. | |
| 6,316,338 B1 | 11/2001 | Jung et al. | |
| 6,320,227 B1 | 11/2001 | Lee et al. | |
| 6,322,625 B2 | 11/2001 | Im | |
| 6,326,186 B1 | 12/2001 | Kirk et al. | |
| 6,326,215 B1 | 12/2001 | Keen | |
| 6,326,286 B1 | 12/2001 | Park et al. | |
| 6,333,232 B1 | 12/2001 | Kunikiyo et al. | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 * | 4/2002 | Im | 438/487 |
| 6,388,146 B1 | 5/2002 | Onishi et al. | |
| 6,388,386 B1 | 5/2002 | Kunii et al. | |
| 6,392,810 B1 | 5/2002 | Tanaka et al. | |
| 6,393,042 B1 | 5/2002 | Tanaka et al. | |
| 6,407,012 B1 | 6/2002 | Miyasaka et al. | |
| 6,410,373 B1 | 6/2002 | Chang et al. | |
| 6,429,100 B2 | 8/2002 | Yoneda et al. | |
| 6,432,758 B1 | 8/2002 | Cheng et al. | |
| 6,437,284 B1 | 8/2002 | Okamoto et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | |
| 6,455,359 B1 | 9/2002 | Yamazaki et al. | |
| 6,468,845 B1 | 10/2002 | Nakajima et al. | |
| 6,471,772 B1 | 10/2002 | Tanaka | |
| 6,472,684 B1 | 10/2002 | Yamazaki et al. | |
| 6,476,447 B1 | 11/2002 | Yamazaki et al. | |
| 6,479,837 B1 | 11/2002 | Ogawa et al. | |
| 6,482,722 B2 | 11/2002 | Kunii et al. | |
| 6,493,042 B1 | 12/2002 | Bozdagi et al. | |
| 6,495,067 B1 | 12/2002 | Ono et al. | |
| 6,495,405 B2 | 12/2002 | Voutsas et al. | |
| 6,501,095 B2 | 12/2002 | Yamaguchi et al. | |
| 6,504,175 B1 | 1/2003 | Mei et al. | |
| 6,506,636 B2 | 1/2003 | Yamazaki et al. | |
| 6,511,718 B1 | 1/2003 | Paz de Araujo et al. | |
| 6,512,634 B2 | 1/2003 | Tanaka et al. | |
| 6,516,009 B1 | 2/2003 | Tanaka et al. | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,531,681 B1 | 3/2003 | Markle et al. | |
| 6,535,535 B1 | 3/2003 | Yamazaki et al. | |
| 6,555,422 B1 | 4/2003 | Yamazaki et al. | |
| 6,555,449 B1 | 4/2003 | Im et al. | |
| 6,563,077 B2 * | 5/2003 | Im | 219/121.65 |
| 6,573,163 B2 | 6/2003 | Voutsas et al. | |
| 6,573,531 B1 * | 6/2003 | Im et al. | 257/45 |
| 6,577,380 B1 | 6/2003 | Sposili et al. | |
| 6,582,827 B1 | 6/2003 | Im | |
| 6,590,228 B2 | 7/2003 | Voutsas et al. | |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 | 10/2003 | Grigoropoulos et al. | |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,741,621 B2 | 5/2004 | Asano | |
| 6,750,424 B2 | 6/2004 | Tanaka | |
| 6,755,909 B2 | 6/2004 | Jung | |
| 6,784,455 B2 | 8/2004 | Maekawa et al. | |
| 6,830,993 B1 * | 12/2004 | Im et al. | 438/479 |
| 6,858,477 B2 | 2/2005 | Deane et al. | |
| 6,908,835 B2 | 6/2005 | Sposili et al. | |
| 6,916,690 B2 | 7/2005 | Chang | |
| 6,961,117 B2 * | 11/2005 | Im | 355/67 |
| 6,962,860 B2 | 11/2005 | Yamazaki et al. | |
| 6,984,573 B2 | 1/2006 | Yamazaki et al. | |
| 7,029,996 B2 * | 4/2006 | Im et al. | 438/487 |

| | | |
|---|---|---|
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2* | 10/2006 | Im ............................ 438/660 |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2* | 1/2007 | Im et al. ...................... 438/150 |
| 7,164,152 B2* | 1/2007 | Im ................................ 257/64 |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2* | 5/2007 | Im et al. ...................... 438/487 |
| 7,297,982 B2 | 11/2007 | Suzuki et al. |
| 7,311,778 B2* | 12/2007 | Im et al. ...................... 117/200 |
| 7,318,866 B2 | 1/2008 | Im |
| 7,323,368 B2 | 1/2008 | Takayama et al. |
| 7,326,876 B2 | 2/2008 | Jung |
| 7,364,952 B2 | 4/2008 | Im |
| 7,399,359 B2 | 7/2008 | Im et al. |
| 7,622,370 B2* | 11/2009 | Im ................................ 438/487 |
| 7,629,234 B2* | 12/2009 | Bruland ...................... 438/487 |
| 7,645,337 B2* | 1/2010 | Im et al. ...................... 117/43 |
| 7,691,687 B2* | 4/2010 | Im ................................ 438/150 |
| 7,700,462 B2 | 4/2010 | Tanaka et al. |
| 7,709,378 B2* | 5/2010 | Im ................................ 438/660 |
| 7,804,647 B2 | 9/2010 | Mitani et al. |
| 7,964,480 B2* | 6/2011 | Im et al. ...................... 438/487 |
| 8,034,698 B2* | 10/2011 | Im ................................ 438/487 |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1* | 2/2003 | Im ................................ 72/54 |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1* | 3/2005 | Im ................................ 438/487 |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1* | 10/2005 | Im et al. ...................... 117/4 |
| 2005/0236908 A1* | 10/2005 | Rivin .......................... 310/10 |
| 2005/0255640 A1* | 11/2005 | Im et al. ...................... 438/166 |
| 2005/0282319 A1* | 12/2005 | Bruland et al. ............. 438/166 |
| 2006/0030164 A1 | 2/2006 | Im |
| 2006/0035478 A1 | 2/2006 | You |
| 2006/0040512 A1* | 2/2006 | Im ................................ 438/795 |
| 2006/0060130 A1 | 3/2006 | Im |
| 2006/0102901 A1* | 5/2006 | Im et al. ...................... 257/64 |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1* | 11/2006 | Im et al. ...................... 117/43 |
| 2007/0007242 A1 | 1/2007 | Im |
| 2007/0010074 A1 | 1/2007 | Im |
| 2007/0010104 A1 | 1/2007 | Im |
| 2007/0012664 A1* | 1/2007 | Im ................................ 219/121.65 |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1* | 5/2007 | Im ................................ 438/22 |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1* | 2/2008 | Im et al. ...................... 250/492.22 |
| 2008/0124526 A1 | 5/2008 | Im |
| 2008/0176414 A1 | 7/2008 | Im |
| 2009/0001523 A1* | 1/2009 | Im ................................ 257/627 |
| 2009/0137105 A1* | 5/2009 | Im ................................ 438/487 |
| 2009/0140173 A1* | 6/2009 | Im ................................ 250/492.2 |
| 2009/0218577 A1* | 9/2009 | Im ................................ 257/75 |
| 2009/0242805 A1* | 10/2009 | Im ................................ 250/492.2 |
| 2009/0309104 A1* | 12/2009 | Im et al. ...................... 257/75 |
| 2010/0024865 A1 | 2/2010 | Shah et al. |
| 2010/0187529 A1* | 7/2010 | Im ................................ 257/51 |
| 2011/0248278 A1* | 10/2011 | Im et al. ...................... 257/66 |
| 2011/0309370 A1* | 12/2011 | Im ................................ 257/75 |

FOREIGN PATENT DOCUMENTS

| | | |
|---|---|---|
| DE | 19839718 | 3/2000 |
| DE | 10103 670 A1 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |
| JP | H10-244390 | 9/1998 |
| JP | 11025064 A | 1/1999 |

| | | |
|---|---|---|
| JP | 11064883 A | 3/1999 |
| JP | 11-281997 | 10/1999 |
| JP | H11-297852 | 10/1999 |
| JP | 11330000 A | 11/1999 |
| JP | 2000505241 A | 4/2000 |
| JP | 2000-315652 | 11/2000 |
| JP | 2000346618 | 12/2000 |
| JP | 2001023920 A | 1/2001 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 2003-509844 | 3/2003 |
| JP | 20003100653 | 4/2003 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/031869 | 4/2002 |
| WO | WO-0231869 A2 | 4/2002 |
| WO | WO-02/42847 | 5/2002 |
| WO | WO-02/086954 A1 | 10/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017380 | 2/2004 |
| WO | WO-2004/017381 | 2/2004 |
| WO | WO-2004017380 A2 | 2/2004 |
| WO | WO-2004/017382 A3 | 4/2004 |
| WO | WO-2004/075263 A3 | 1/2005 |
| WO | WO-2005/029551 | 3/2005 |
| WO | WO-2005/029550 A3 | 9/2005 |
| WO | WO-2004/017379 A3 | 12/2005 |
| WO | WO-2006/055003 A1 | 5/2006 |
| WO | WO-2005/029548 A3 | 4/2009 |
| WO | WO-2005/029546 A3 | 6/2009 |

OTHER PUBLICATIONS

Biebelsen, D.K., L.E. Fennell and J.C. Zesch, Origin of oriented crystal growth of radiantly melted silicon on SiO/sub 2, Appl. Phys. Lett. 45, 546 (1984). cited by other.

Boyd, I. W., "Laser Processing of Thin Films and Microstructures, Oxidation, Deposition, and Etching of Insulators," Springer—Verlag BerlinHeidelber, 1987. cited by other.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989). cited by other.

Brotherton et al., "Influence of Melt Depth in Laser Crystallized Poly-Si Thin Film Transistors," J. Appl. Phys., 82:4086 (1997). cited by other.

Brotherton, "Polycrystalline Silicon Thin Film Transistors," Semicond. Sci. Tech., 10:721-738 (1995). cited by other.

Crowder et al., "Low-Temperature Single-Crystal Si TFT's Fabricated on Si Films processed via Sequential Lateral Solidification", IEEE Electron Device Letter, 19 (8): 306 (1998). cited by other.

Crowder et al., "Parametric Investigation of SLS-processed Poly-silicon Thin Films for TFT Application," Preparations and Characterization, Elsevier, Sequoia, NL, vol. 427, No. 1-2, Mar. 3, 2003, pp. 101-107, XP004417451. cited by other.

Crowder et al., "Sequential Lateral Solidification of PECVD and Sputter Deposited a-Si Films", Mat. Res. Soc. Symp. Proc. 621:Q.9.7.1-9.7.6, 2000. cited by other.

Dassow, R. et al., "Laser crystallizationof silicon for high-performance thin-film transistors," Semicond. Sci. Technol., 2000, pp. L31-L34, vol. 15, UK.

Dassow, R. et al., Laser-Crystallized Polycrystalline Silicon on Glass for Photovoltaic Applications, Solid State Phenomena, pp. 193-198, vols. 67-68, Scitec Publications, Switzerland.

Dassow, R. et al., "Nd:YVO4 Laser Crystallization for Thin Film Transistors with a High Mobility," Mat. Res. Soc. Symp. Proc., 2000, Q9.3.1-Q9.3.6, vol. 621, Materials Research Society.

Dimitriadis, C.A., J. Stoemenos, P.A. Coxon, S. Friligkos, J. Antonopoulos and N. A. Economou, Effect of pressure on the growth of crystallites of low-pressure chemical-vapor-deposited polycrystalline silicon films and the effective electron mobilityunder high normal field in thin-film transsitors, J. Appl. Phys. 73, 8402 (1993). cited by other.

Endert et al., "Excimer Laser: A New Tool for Precision Micromachining," Optical and Quantum Electronics, 27:1319 (1995). cited by other.

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993). cited by other.

Geis et al., "Crystallographic orientation of silicon on an amorphous substrate using an artificial surface-relief grating and laser crystallization," Appl. Phys. Lett. 35(1) Jul. 1, 1979, 71-74. cited by other.

Geis et al., "Silicon graphoepitaxy using a strip-heater oven," Appl. Phys. Lett. 37(5), Sep. 1, 1980, 454-456. cited by other.

Geis et al., "Zone-Melting recrystallization of SI Films with a moveable-strip heater oven" J. Electro-Chem. Soc., 129: 2812 (1982). cited by other.

Gosain et al., "Formation of (100)—Textured Si Film Using an Excimer Laser on a Glass Substrate," Jpn. J. Appl. Phys., vol. 42 (2003), pp. L135-L137.

Gupta et al., "Numerical Analysis of Excimer-laser induced melting and solidification of Si Thin Films", Applied Phys. Lett., 71:99, 1997. cited by other.

Hau-Riege et al., "The Effects Microstructural Transitions at Width Transitions on Interconnect reliability," Journal of Applied Physics, 87(12): 8467-8472. cited by other.

Hawkins, W.G. et al., "Origin of lamellae in radiatively melted silicon films," Appl. Phys. Lett. 42(4), Feb. 15, 1983. cited by other.

Hayzelden, C. and J.L. Batstone, Silicide formation and silicide-mediated crystallization of nickel-implanted amorphous silicon thin films, J. Appl. Phys. 73, 8279 (1993). cited by other.

Im et al., "Controlled Super-Lateral Growth of Si Films for Microstructural Manipulation and Optimization", Phys. Stat. Sol. (a), 166:603 (1998). cited by other.

Im et al., "Crystalline Si Films for Integrated Active-Matrix Liquid-Crystals Displays," MRS Bulletin 21:39 (1996). cited by other.

Im et al., "On the Super Lateral Growth Phenomenon Observed in Excimer Laser-Induced Crystallization of Thin Si Films," Appl. Phys. Lett., 64 (17): 2303 (1994). cited by other.

Im et al., "Phase Transformation Mechanisms Involved in Excimer Laser Crystallization of Amorphous Silicon Films," Appl. Phys. Lett., 63 (14):1969 (1993). cited by other.

Im et al., "Single-Crystal Si Films for Thin-Film Transistor Devices," Appl. Phys. Lett., 70(25):3434 (1997). cited by other.

Im, J.S., Method and system for producing crystalline thin films with a uniform crystalline orientation, application # 60/503419; ref. file # 36013(BB); Columbia ref. M02-063.

Ishida et al., "Ultra-shallow boxlike profiles fabricated by pulsed ultraviolet-laser doping process", J. Vac. Sci. Technol. B 12(1): 399-403, (1994). cited by other.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, 34(8A):3976-3981 (1995). cited by other.

Jeon et al., "Two-step laser recrystallization of poly-Si for effective control of grain boundaries", Journal of Non Crystalline Solids, 266-269: 645-649 (2000). cited by other.

Jung, Y.H. et al., "Low Temperature Polycrystalline Si TFTs Fabricated with Directionally Crystallized Si Film," Mat. Res. Soc. Symp. Proc. vol. 621, Z8.3.1-6, 2000.

Jung, Y.H. et al., "The Dependence of Poly-Si TFT Characteristics on the Relative Misorientation Between Grain Boundaries and the Active Channel," Mat. Res. Soc. Symp. Proc., vol. 621, Q9.14.1-6, 2000.

Kahlert, H., "Creating Crystals," OE Magazine, Nov. 2001, 33-35. cited by other.

Kim et al., "Grain Boundary Location-Controlled Poly-Si Films for TFT Devices Obtained Via Novel Excimer Laser Process," Mat. Res. Soc. Symp. Proc. vol. 358, 1995. cited by other.

Kim et al., "Multiple Pulse Irradiation Effects in Excimer Laser-Induced Crystallization of Amorphous Si Films," Mat. Res. Soc. Sym. Proc., 321:665-670 (1994). cited by other.

Kim, "Excimer-Laser-Induced Crystallization of Amorphous Silicon Thin Films", Ph. D. Dissertation Abstract, Columbia University, 1996. cited by other.

Kim, C. et al., "Development of SLS-Based SOG Display," IDMC 2005, pp. 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993. cited by other.

Kim, H.-J., et al., "The effects of dopants on surface-energy-driven secondary grain growth in silicon films," J. Appl. Phys. 67 (2), Jan. 15, 1990. cited by other.

Kim, H.J. et al., "New Excimer-laser-crystallization method for producing large-grained and grain boundary-location-controlled Si Films for Thin Film Transistors", Applied Phys. Lett., 68: 1513. cited by other.

Kimura, M. and K. Egami, Influence of as-deposited film structure on (100) texture in laser-recrystallized silicon on fused quartz, Appl. Phys. Lett. 44, 420 (1984). cited by other.

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., "Large-grained polycrystalline silicon on glass by copper vapor laser annealing," Thin Solid Films, 1999, pp. 129-132, vol. 337, Elsvier.

Kung, K.T.Y. And R. Reif, Implant-dose dependence of grain size and (110) texture enhancements in polycrystalline Si films by seed selection through ion channeling, J. Appl. Phys. 59, 2422 (1986). cited by other.

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985). cited by other.

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993). cited byother.

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657(1994). cited by other.

Lee, S.-W. And S.-K. Joo, Low temperature poly-Si thin-film transistor fabrication by metal-induced lateral crystallization, IEEE Electron Device Letters 17, 160 (1996). cited by other.

Lee, S.-W., Y.-C. Jeon and S.-K. Joo, Pd induced lateral crystallization of amorphous Si thin films, Appl. Phys. Lett. 66, 1671 (1995). cited by other.

Leonard, J.P. et al, "Stochastic modeling of solid nucleation in supercooled liquids", Appl. Phys. Lett. 78:22, May 28, 2001, 3454-3456. cited by other.

Limanov, A. et al., "Single-Axis Projection Scheme for Conducting Sequential Lateral Solidification of Si Films for Large-Area Electronics," Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B. et al., "Development of Linear Sequential Lateral Solidification Technique to Fabricate Quasi-Single-Crystal Superthin Si Films for High-Performance Thin Film Transistor Devices," Perspectives, Science, and Technologies for Novel Silicon on Insulator Devices, Eds. P.L.F. Hemment et al., Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68:175-180(1998). cited by other.

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983). cited by other.

MICRO/LAS Lasersystem GmbH, "Overview of Beam Delivery Systems for Excimer Lasers," (1999). cited by other.

MICRO/LAS Lasersystem GmbH, "UV Optics Systems for Excimer Laser Based Micromachining and Marking" (1999). cited by other.

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002). cited by other.

Muyata et al, "Low-Temperature Polycrystalline Silicon Thin-Film Transistors for Large-Area Liquid Crystal Display," Japanese J. Of Applied Physics Part 1—Regular Papers Short Notes & Review Papers, 31:4559-62 (1992). cited by other.

Nebel, "Laser Interference Structuring of A-Si:h" Amorphous Silicon Technology—1996, San Francisco, CA Apr. 8-12, Materials Research Society Symposium Proceedings, vol. 420, Pittsburgh, PA (1996). cited by other.

Nerding, M., et al., Tailoring texture in laser crystallization of silicon thin-films on glass, Solid State Phenom. 93, 173 (2003). cited by other.

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993). cited by other.

Ozawa et al., "Two-Dimensionally Position-Controlled Excimer-Laser-Crystallization of Silicon Thin Films on Glassy Substrate", Jpn. J. Appl. Phys. 38(10):5700-5705 (1999). cited by other.

Ozawa et al., "Two-Dimensionally Position-Controlled Excimer-Laser-Crystallization of Silicon Thin Films on Glassy Substrate," Jpn. J. Appl. Phys. 38(10):5700-5705 (1999). cited by other.

Sato et al., "Mobility anisotropy of electrons in inversion layers on oxidized silicon surfaces" Physical Review B (State) 4, 1950 (1971). cited by other.

Smith, H.I. et al., "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165, 1996. cited by other.

Sposili et al., "Line-scan sequential lateral solidification of Si thin films", Appl. Phys. A67, 273-6, 1998. cited by other.

Sposili et al., "Sequential Lateral Solidification of Thin Silicon Films on SiO2", Appl. Phys. Lett., 69(19): 2864 (1996). cited by other.

Sposili et al., "Single-Crystal Si Films via a Low-Substrate-Temperature Excimer-Laser Crystallization Method", Mat. Res. Soc. Symp. Proc., 452: 953-958 (1997). cited by other.

Thompson, C.V. and H.I. Smith, Surface-energy-driven secondary grain growth in ultrathin (<100 nm) films of silicon, Appl. Phys. Lett. 44, 603 (1984). cited by other.

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003. cited byother.

Voutsas, A.T. et al., "A new era of crystallization: advances in polysilicon and crystal engineering," Applied Surface Science 250-262, 2003.

Voutsas, A.T. et al.: "Effect of process parameters on the structural characteristics of laterally grown, laser-annealed polycrystalline silicon films," Journal of applicaed Physics, vol. 94, No. 12, Dec. 15, 2003. cited by other.

Watanabe et al., "Crystallization Process of Polycrystalline Silicon by KrF Excimer Laser Annealing," Japanese J. of Applied Physics Part 1—Regular Papers Short Notes & Review Papers, 33:4491-98 (1994). cited by other.

Weiner, K. H. et al. "Laser-assisted, Self-aligned Silicide Formation," A Verdant Technologies technical brief, Aug. 7, 1997, 1-9. cited by other.

Weiner, K. H. et al., "Ultrashallow Junction Formation Using Projection Gas Immersion Laser Doping (PGILD)," A Verdant Technologies Technical Brief, Aug. 20, 1997. cited by other.

Werner, J.H. et al., "From polycrystalline to single crystalline silicon on glass," Thin Solid Films 383, 95-100, 2001.

White et al., "Characterization of thin-oxide MNOS memory transistors" IEEE Trans. Electron Devices ED-19, 1280 (1972). cited by other.

Yamamuchi et al., "Polycrystalline silicon thin films processed with silicon ion implantation and subsequent solid-phase crystallization: Theory, experiments, and thin-film transistor applications" Journal of Applied Physics, 75(7):3235-3257 (1994). cited by other.

Yoshimoto et al., "Excimer-Laser-Produced and Two-Dimensionally Position-Controlled Giant Si Grains on Organic SOG Underlayer", p. 285-286, AM-LCD (2000). cited by other.

International Search Report and Written Opinion for corresponding International Patent Application No. PCT/US2010/033565, mailed Jul. 1, 2010, 1 page.

International Search Report and Written Opinion for corresponding International Patent Application No. PCT/US2010/055106, mailed Jan. 4, 2011, 1 page.

Andräet al., "A new technology for crystalline silicon thin film solar cells on glass based on the laser crystallization," IEEE, pp. 217-220 (2000).

Andräet al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

Kim, C. et al., Development of SLS-Based SOG Display, IDMC 2005, Thu-15-02, 252-255.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

* cited by examiner

SINGLE SCAN IRRADIATION FOR CRYSTALLIZATION OF THIN FILMS

RELATED APPLICATIONS

This application is a divisional of U.S. patent application Ser. No. 11/876,974, filed Oct. 23, 2007, now U.S. Pat. No. 7,964,480 issued Jun. 21, 2011 and entitled "Single Scan Irradiation for Crystallization of Thin Films," which is a divisional of U.S. patent application Ser. No. 10/944,350, filed Sep. 17, 2004, now U.S. Pat. No. 7,311,778 issued Dec. 25, 2007 and entitled "Single Scan Irradiation for Crystallization of Thin Films," which claims priority under 35 U.S.C. §119(e) to U.S. Application Ser. No. 60/504,270, filed Sep. 19, 2003, and entitled "Single Scan Irradiation for Crystallization of Thin Films," the contents of each are incorporated herein by reference.

FIELD OF THE INVENTION

This invention relates to methods and systems for processing thin film material, and more particularly to forming large-grained, grain-boundary-location controlled thin films from amorphous or polycrystalline thin films using laser irradiation. In particular the present invention relates to methods and systems for the production of integrated thin film transistors.

BACKGROUND OF THE INVENTION

In recent years, various techniques for crystallizing or improving the crystallinity of an amorphous or polycrystalline semiconductor film have been investigated. This technology is used in the manufacture of a variety of devices, such as image sensors and active-matrix liquid-crystal display (AM-LCD) devices. In the latter, a regular array of thin-film transistors (TFT) is fabricated on an appropriate transparent substrate, and each transistor serves as a pixel controller.

Sequential lateral solidification (SLS) using an excimer laser is one method for fabricating high quality polycrystalline films having large and uniform grains. A large-grained polycrystalline film can exhibit enhanced switching characteristics because the number of grain boundaries in the direction of electron flow is reduced. SLS processing controls the location of grain boundaries. U.S. Pat. Nos. 6,322,625, 6,368,945, 6,555,449 and 6,573,531 issued to Dr. James Im, the entire disclosures of which are incorporated herein by reference, and which are assigned to the common assignee of the present application, describe such SLS systems and processes.

In an SLS process, an initially amorphous or poly crystalline film (for instance, a continuous wave (CW)-processed Si film, an as-deposited film, or solid-phase crystallized film) is irradiated by a narrow laser beamlet. The beamlet is formed by passing a laser beam through a patterned mask, which is projected onto the surface of the film. The beamlet melts the precursor film, and the melted film then recrystallizes to form one or more crystals. The crystals grow primarily inward from edges of the irradiated area towards the center. After an initial beamlet has crystallized a portion of the film, a second beamlet irradiates the film at a location less than the lateral growth length from the previous beamlet. In the newly irradiated film location, crystal grains grow laterally from the crystal seeds of the polycrystalline material formed in the previous step. As a result of this lateral growth, the crystals attain high quality along the direction of the advancing beamlet. The elongated crystal grains are generally perpendicular to the length of the narrow beam and are separated by grain boundaries that run approximately parallel to the long grain axes.

Although the resultant polycrystalline films have elongated grains with enhanced mobilities, the many iterative steps of irradiation and translation result in low throughput rates. There is a need to increase the throughput rates in the processing of semiconductor materials without sacrificing the quality of the processed materials.

SUMMARY OF THE INVENTION

In one aspect, the present invention provides a single scan irradiation technique for crystallization of thin films. In other aspects, the present invention provides methods and systems for processing amorphous or polycrystalline precursor films to produce films of higher crystallinity. The present invention also provides polycrystalline films of varying degrees of crystallinity and crystalline grain orientation.

In one aspect of the present invention, a method is provided for processing a selected region of a film in a single laser scan across the selected film region. The method includes translating a film in a first direction, e.g., y-direction, while simultaneously translating a mask in a second direction, e.g., the x-direction and/or y-direction. The mask projects a patterned laser beam or a set of patterned laser beams (hereinafter referred to as a "a patterned laser beam") onto the film surface. The mask pattern and the translation pathways and speeds for the film and mask are selected so that the selected film region is substantially completely crystallized in a single scan of the film region by the laser.

By "completely crystallized" it is meant that the selected region of the film possesses the desired microstructure and crystal orientation, so that no further laser scanning of the region is required. In some instances, the entire surface area of the selected regions is crystallized. In other instances, bands or islands of the selected regions are crystallized. A film region is considered "completely crystallized" if the desired level of crystallization is achieved in the selected region of the film.

According to one aspect of the invention, a method of crystallizing a film includes generating a plurality of laser beam pulses, directing the plurality of laser beam pulses through a mask to generate a plurality of patterned laser beams, and irradiating a portion of a selected region of a film with one of the plurality of patterned beams having an intensity that is sufficient to melt the irradiated portion of the film, wherein the irradiated portion of the film crystallizes upon cooling. The film moves along a first translation pathway and the mask moves along a second translation pathway while successive portions of the selected region are irradiated with patterned beams, such that the selected region of the film are substantially completely crystallized in a single traversal of patterned beams over the selected region of the film.

In one or more embodiments of the present invention, the process provides constant or oscillating motion of the mask in one direction, e.g., along the x-axis, while the film is continuously advanced in another direction, e.g., along the y-axis. The resultant polycrystalline film possesses columns of elongated grains having long grain boundaries whose locations are controlled by the spatially confined melting and crystallization of the film.

In another aspect of the invention, a method for processing a film includes generating a plurality of laser beam pulses, directing the plurality of laser beam pulses through a mask having a mask pattern with a length l, a width w, and a spacing between adjacent patterns d to generate a plurality of patterned laser beams, wherein each of the patterned beams has a length l', a width w' and a spacing between adjacent patterned beams d', and irradiating a portion of a region of the film with one of the plurality of patterned beams. The mask and patterned beam proportions, e.g., w and w', l and l', and d and d', are related by the demagnification factor of the projection optics. The patterned beam has an intensity that is sufficient to melt an irradiated portion, and the irradiated portion crystallizes upon cooling. The film is moved at constant velocity in a y-direction, and the mask is moved in the x-direction while the film is irradiated with the patterned beam. The patterned beam is advanced a distance of about l'/n−δ in the y-direction from the one irradiation pulse to the next, where δ is a value selected to form an overlap in adjacent irradiated portions and a distance of about λ', where λ'=w'+d,' in the x-direction over a selected number of irradiation pulses n.

In one or more embodiments of the present invention, n is in the range of 2 to about 25. In one or more embodiments of the present invention, n is 2, the y-translation distance of the patterned beam is about l'/2−δ, and the x-translation of the patterned beam distance is about λ'/2.

In one or more embodiments of the present invention, the process provides constant or oscillating motion of the patterned beam in one direction, e.g., along the x-axis, while the patterned beam is also continuously advanced in another direction, e.g., along the y-axis. The resultant polycrystalline film possesses columns of elongated grains having long grain boundaries (substantially aligned with the length of the column) whose locations are controlled by the spatially confined melting and crystallization of the film.

According to one embodiment of the present invention, the x- and y-translations of the patterned beam are selected to provide columns of elongated polycrystalline material that are positioned at an angle relative to the axes of translation.

In another aspect of the invention, a device includes a polycrystalline thin film having columns of elongated crystal grains separated by location-controlled grain boundaries that are tilted at an angle theta (θ) with respect to an edge of the thin film substrate, wherein θ is greater than 0° and ranges up to about 45°. Theta (θ) is referred to as the "tilt angle" of the column of crystallized material.

In another aspect of the invention, a device containing a polycrystalline thin film transistor (TFT) includes a polycrystalline thin film defined by x- and y-axes. A TFT device is located in the thin film and is substantially aligned with the x- and y-axes of the thin film. The polycrystalline thin film has a periodic polycrystalline structure including columns of elongated crystal grains. A column is substantially aligned with the x- and y-axes of the film; however, the elongated crystals within the column contain location controlled grain boundaries that are oriented at an angle with respect to the x- and y-axes of the film. The TFT device is positioned at an angle with respect to the grain boundaries of the elongated crystals. In one or more embodiments, the number of long grain boundaries in each thin film transistor device remains substantially uniform.

In one aspect, the method avoids the need to scan the same area of the substrate multiple times in order to fully crystallize the film. It also provides a simpler and time-efficient process that translates the system in the x- and y-directions during laser irradiation. Furthermore, it provides grains that are elongated beyond their characteristic lateral growth length, thereby further improving the crystalline properties of the polycrystalline film.

BRIEF DESCRIPTION OF THE DRAWING

Various features of the present invention can be more fully appreciated with reference to the following detailed description of the invention when considered in connection with the following drawing, in which like reference numerals identify like elements. The following figures are for the purpose of illustration only and are not intended to be limiting of the invention, the scope of which is set forth in the claims that follow.

DETAILED DESCRIPTION OF THE INVENTION

Sequential lateral solidification is a particularly useful lateral crystallization technique because it is capable of grain boundary location-controlled crystallization and provides crystal grains of exceptionally large size. Sequential lateral solidification produces large grained structures through small-scale translation of a thin film between sequential pulses emitted by a pulsed laser. As the film absorbs the energy of each pulse, a small area of the film melts completely and recrystallizes laterally from the solidus/melt interface to form a crystalline region. By "lateral crystal growth" or "lateral crystallization," as those terms are used herein, it is meant a growth technique in which a region of a film is melted to the film/surface interface and in which recrystallization occurs in a crystallization front moving laterally across the substrate surface. "Characteristic lateral growth length," as that term is used herein, means the length of unimpeded lateral growth of a crystalline grain in a single irradiation step under set irradiation conditions and sample configuration.

The thin film may be a metal or semiconductor film. Exemplary metals include aluminum, copper, nickel, titanium, gold, and molybdenum. Exemplary semiconductor films include conventional semiconductor materials, such as silicon, germanium, and silicon-germanium. Additional layers situated beneath or above the metal or semiconductor film are contemplated. The additional layers can be made of silicon oxide, silicon nitride and/or mixtures of oxide, nitride or other materials that are suitable, for example, for use as a thermal insulator to protect the substrate from overheating or as a diffusion barrier to prevent diffusion of impurities from the substrate to the film.

Figure 1:
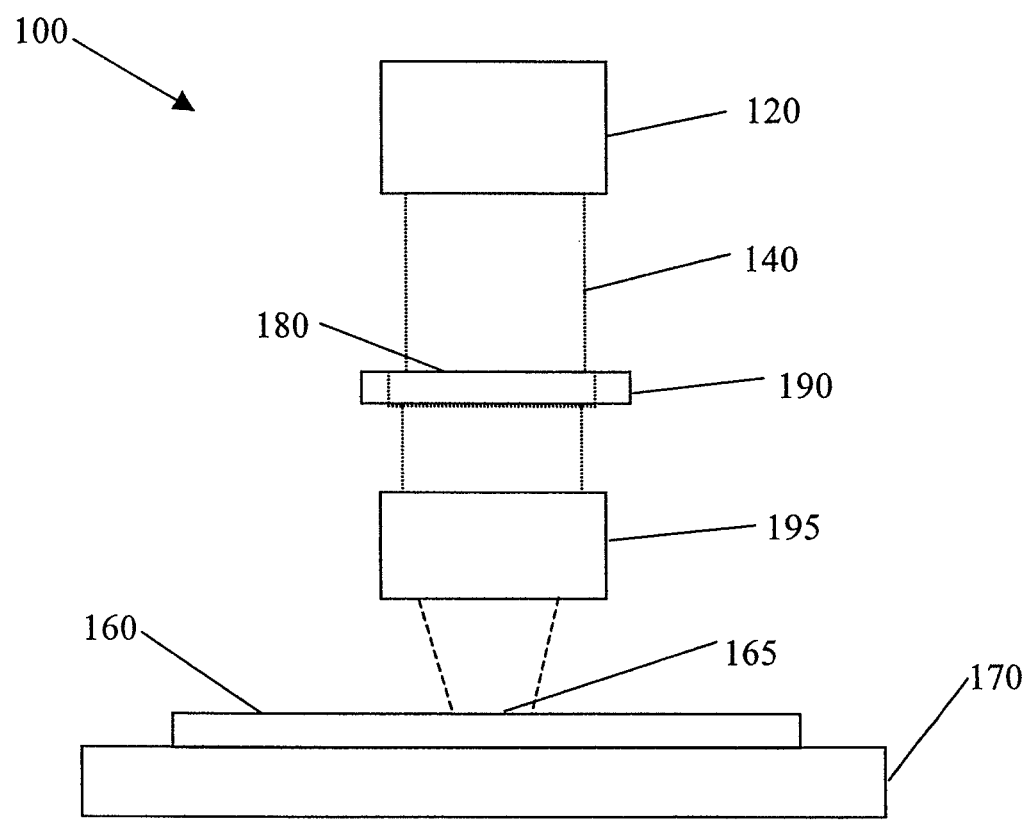
FIG. 1 is a schematic illustration of an exemplary system for performing a sequential lateral solidification process according to one or more embodiments of the present invention.

Referring to FIG. 1, an apparatus 100 is shown that may be used for sequential lateral solidification. Apparatus 100 has a laser source 120. Laser source 120 may include a laser (not shown) along with optics, including mirrors and lenses, which shape a laser beam pulse 140 (shown by dotted lines) and direct it toward a substrate 160, which is supported by a stage 170. The laser beam 140 passes through a mask 180 supported by a mask holder 190. The mask holder is capable of translation in at least one direction. Exemplary laser beam pulses 140 generated by the beam source 120 can provide a beam intensity in the range of 10 mJ/cm$^2$ to 1 J/cm$^2$, a pulse duration in the range of 10 to 300 ns and a pulse repetition rate in the range of 10 Hz to 300 Hz. Currently available commercial lasers such as Lambda Steel 1000 available from Lambda Physik, Ft. Lauderdale, Fla., can achieve this output. Higher laser energy and larger mask sizes are possible with increasing laser power. After passing through the mask 180, the laser beam pulse 140 passes through projection optics 195 (shown schematically). The projection optics 195 reduces the size of the laser beam and simultaneously increases the intensity of the optical energy striking the substrate 160 at a desired location 165. The demagnification in each direction is typically on the order of between 3× and 7× reduction, for example, a 5× reduction, in image size. For a 5× reduction, the image of the mask 180 striking the surface at the location 165 has 25 times less total area than the mask, correspondingly increasing the energy density of the laser beam pulse 140 at the location 165 by a factor of 25. Due to the demagnification effect of the laser optics, the mask translation distance is greater than the translation distance of the beam where it impinges on the substrate. The translation distances of the mask and of the beam on the substrate surface differ by approximately the demagnification factor of the projection optics.

The stage 170 is a precision x-y stage that can accurately position the substrate 160 under the beam 140. The stage 170 can also be capable of motion along the z-axis, enabling it to move up and down to assist in focusing or defocusing the image of the mask 180 produced by the laser beam 140 at the location 165. In another embodiment of the method of the present invention, it is possible for the stage 170 to also be able to rotate.

A thin film is processed into a polycrystalline thin film by generating a plurality of excimer laser pulses of a predetermined fluence, controllably modulating the fluence of the excimer laser pulses, homogenizing the intensity profile of the laser pulse plane, masking each homogenized laser pulse to define patterned laser beams, irradiating the thin film with the laser beams to effect melting of portions thereof, and controllably and continuously translating the sample and the mask to move the patterned beam across the substrate surface. The laser pulse frequency and the movement (speed and direction) of the sample are adjusted so that the areas of sequential irradiation of the sample overlap from one irradiation/crystallization cycle to the next, so as to provide for the lateral crystal growth that gives rise to large grains. Pulse frequency and stage and mask position may be coordinated and controlled by a computer. Systems and methods for providing continuous motion sequential lateral solidification are provided in U.S. Pat. No. 6,368,945, which is incorporated in its entirety by reference.

Figure 2:
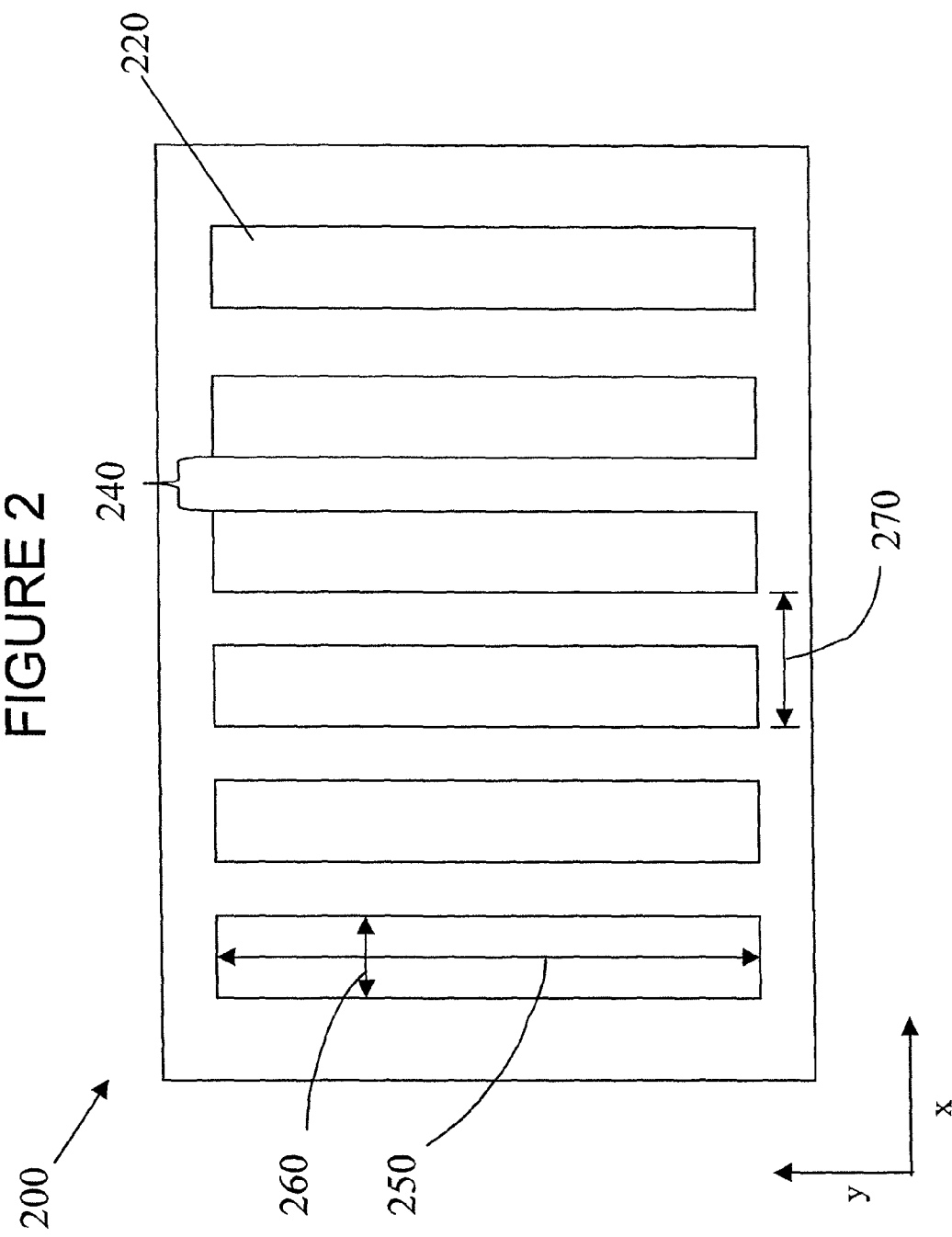
FIG. 2 is a schematic illustration of a mask for use in a sequential lateral solidification process according to one or more embodiments of the present invention.

FIG. 2 shows a mask 200 having a plurality of slits 220 with slit spacing d 240. FIG. 2 alternatively illustrates an intensity pattern generated on a substrate surface by an irradiation laser beam pulse defined by the mask. As noted above, the mask dimensions and the intensity patterns are related by a scaling factor that is a function of the demagnification. The length/of the mask feature is indicated by arrow 250. In one or more embodiments, it is chosen to be commensurate with the dimensions of the device that is to be fabricated on the substrate surface. The width w of the mask feature is indicated by arrow 260 and also can vary. The dimensions l and w are not shown to scale; in many instances the length is considerably greater than the width. In exemplary embodiments, width w is chosen to be small enough to avoid small grain nucleation within the melt zone, yet large enough to maximize lateral crystalline growth for each excimer pulse. In one or more embodiments, the slit spacing d 240 is less than the slit width 260. The mask can be fabricated from a quartz substrate and includes a metallic or dielectric coating that is etched by conventional techniques to form a mask having features of any shape or dimension.

The dimensions of the mask features may depend on a number of factors, such as the energy density of the incident laser pulse, the duration of the incident laser beam pulse, the thickness of the semiconductor thin film, the temperature and thermal conductivity of the substrate. From the standpoint of processing efficiency, the width of the slit-shaped mask feature is as large as possible so as to maximize surface coverage. However, width is also determined by the desire to completely melt the thin film throughout its thickness and to avoid nucleation within the melted portions during crystallization. By way of example only, the mask feature are of a dimension sufficient to create a beam dimension in the range of about 0.5-1 mm long, about two to five micrometers (μm) wide, and a slit spacing of about one to three micrometers (μm). The actual mask dimensions are a function of the demagnification factor (discussed above).

Figure 3:
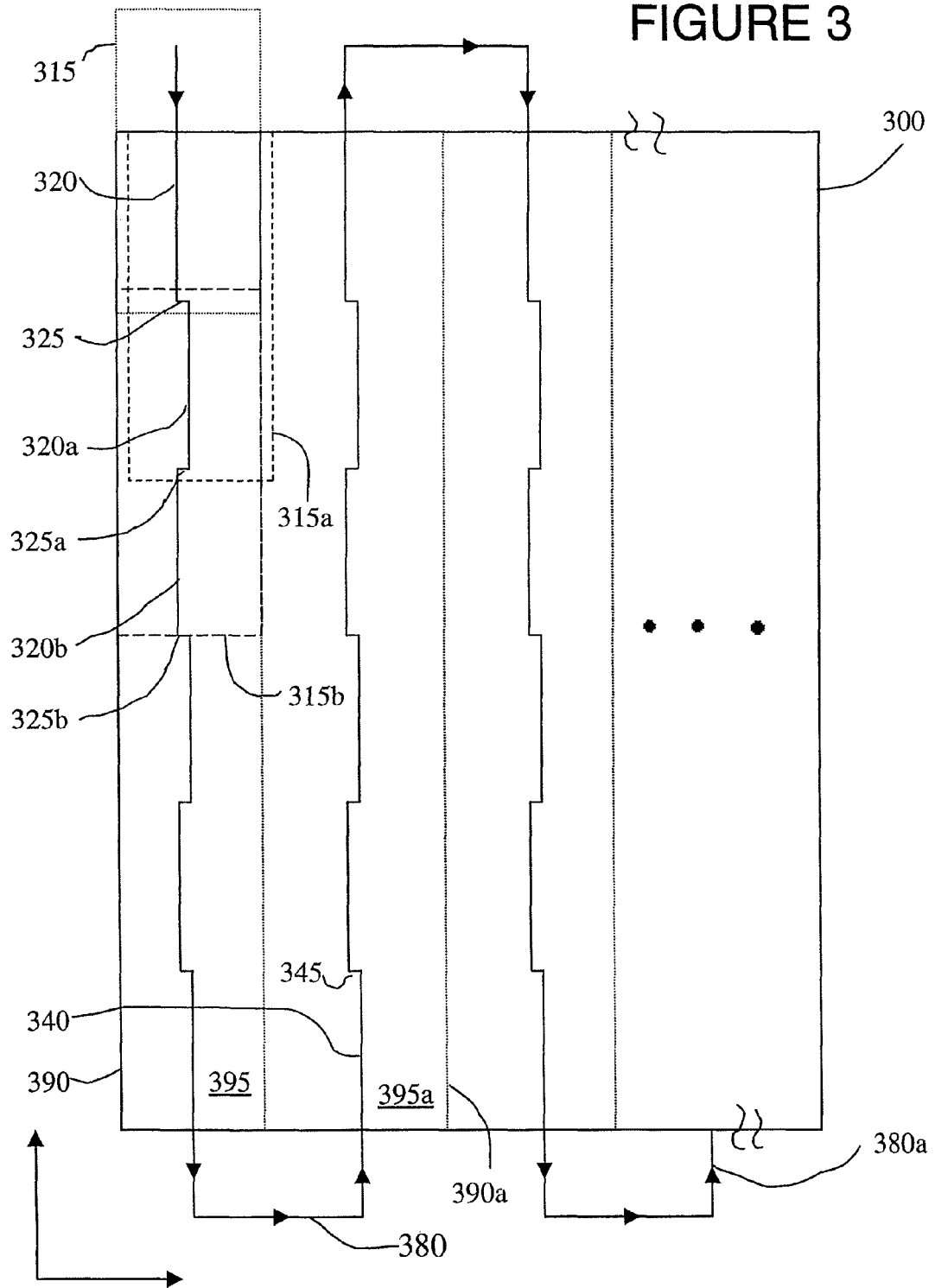
FIG. 3 shows an exemplary irradiation path of laser beam pulses on a sample surface as the sample is processed using the system of FIG. 1.

FIG. 3 shows an exemplary irradiation path 310 of beam pulses impinging on a thin film 300 as it is processed according to one or more embodiments of the invention. The irradiation path 310 indicates the path of the laser beam pulses as the substrate and the mask are translated in the x- and y-directions relative to a stationary laser beam (although in one or more embodiments, it is contemplated that the laser is capable of movement to provide some or all of the desired translations). Arrows indicate the direction (and sequence) of translations. The translations are accomplished by the coordinated movement of the film-bearing substrate (on a movable stage) and the mask. Dashed lines 390, 390a, etc. define imaginary columns 395, 395a, etc. on the substrate surface, each of which is irradiated and crystallized in a single traversal of the laser across the substrate surface (or a selected region of the substrate surface). The magnitude of the x- and y-translations are not shown to scale; and the x-translations are typically much smaller than the y-translations. In one or more embodiments of the present invention, the sample moves continuously in a straight line direction, e.g., in the positive y-direction or in the negative y-direction, and the mask is translated in the transverse direction, e.g., ±x-direction. The mask may oscillate back and forth in the x-direction, e.g., ±-x-direction, or it may move continuously in a straight path, e.g., in the positive x-direction. In one or more embodiments of the present invention, the mask translates in both the x- and y-directions.

Processing according to one or more embodiments of the present invention is described with reference to FIG. 2 and FIG. 3. The mask and the stage on which the sample is located are positioned to provide an illumination pattern at an initial position 315 (shown by dotted lines in FIG. 3) where the pulsed laser beam passing through the mask generates a first intensity pattern on the film. For reasons that will become apparent in the discussion that follows, only a portion, e.g., one-half, of the mask is used for the first irradiation step. That is, the sample is positioned under the mask so that, for example, ½ l of the slit length 250 of mask 200 is exposed onto the substrate surface. The sample moves continuously in the y-direction at a velocity that is calculated to position the sample in the correct location relative to the mask by the time the laser pulses again. Thus, the sample moves in the positive y-direction a distance 320 that results in the repositioning of the illumination pattern. The distance is a function of the mask dimensions and the inverse of the laser demagnification factor and is less than half the length of the projected illumination pattern, i.e., the "projected length," of the mask slit, i.e., l'/2−δ, where l' is the projected length of the mask slit and δ is a small value to ensure that the irradiated portions of the film overlap from a first irradiation position to the next. In an exemplary embodiment, δ is about 1-10% of the projected length l'. During this time, the mask also is microtranslated a distance 325 in the positive x-direction that is about ½λ, where λ is the distance from the leading edge of the first mask slit to the leading edge of the next adjacent slit, shown as arrow 270 in FIG. 2, i.e., λ=w+d. Note, however, that the beam dimension moves only a distance of ½λ' due to the demagnification factor of the laser beam. x- and y-translations are designed so that the sample and mask are in position for the next laser pulse. It will be appreciated that, while the translation distances of both the mask and the substrate are a function of the mask dimensions, they are typically located at opposite sides of the laser demagnification process, and the actual translation distances are adjusted accordingly.

After the first translation, the illumination pattern is at position 315a (shown in FIG. 3 by small dashed lines). In one or more embodiments of the present invention, the irradiated pattern at position 315a overlaps slightly with adjacent column 395a, which ensures that the full sample surface is irradiated. The overlap is selected to maximize extent of the film coverage, while ensuring that the film surface is fully irradiated. The width of the overlap is small, and can be, for example, 0.5 μm, 1 μm, 1.5 μm, or greater. A second laser beam pulse generates a second intensity pattern on the film. Next, the sample is further translated in the positive y-direction along path 320a and the mask is translated in the negative x-direction along path 325a to arrive at position 315b (shown as large dashed lines in FIG. 3). Sample translation continues in this manner along path 320b, 325b, etc. until the sample reaches a predetermined endpoint.

Upon reaching the predetermined endpoint, a single scan or translation of the sample region is complete, and the sample is moved along arrows 380 to a new start position at a new column 395a on the film and irradiation and translation in the reverse direction, e.g., along irradiation path 340, 345, etc. is carried out. It will be appreciated that the sample is now translated continuously in the negative y-direction. In this manner, the entire surface of the thin film is irradiated without disruption of the pulsed laser. Although FIG. 3 shows an irradiation path that traverses from one edge of the substrate to the other edge of the substrate, it is within the scope of the invention to define an irradiation path that traverses only a portion of a substrate. The endpoint can be at the sample edge or it can be a predetermined location within the film, for example, when it is desired to crystallize only a portion of the film surface according to the process described herein.

Figure 4A:
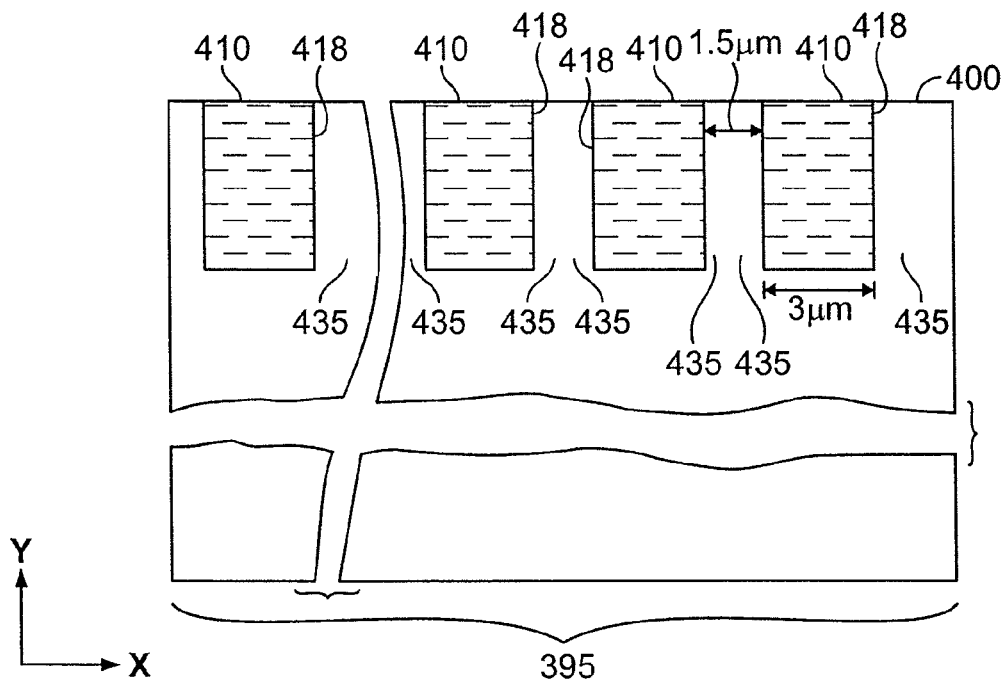
FIGS. 4A-4F show the laser beam irradiation patterns and portions of the resulting grain structures obtained during sequential laser beam processing on an exemplary first column of a sample having a film thereon.
Figure 4B:
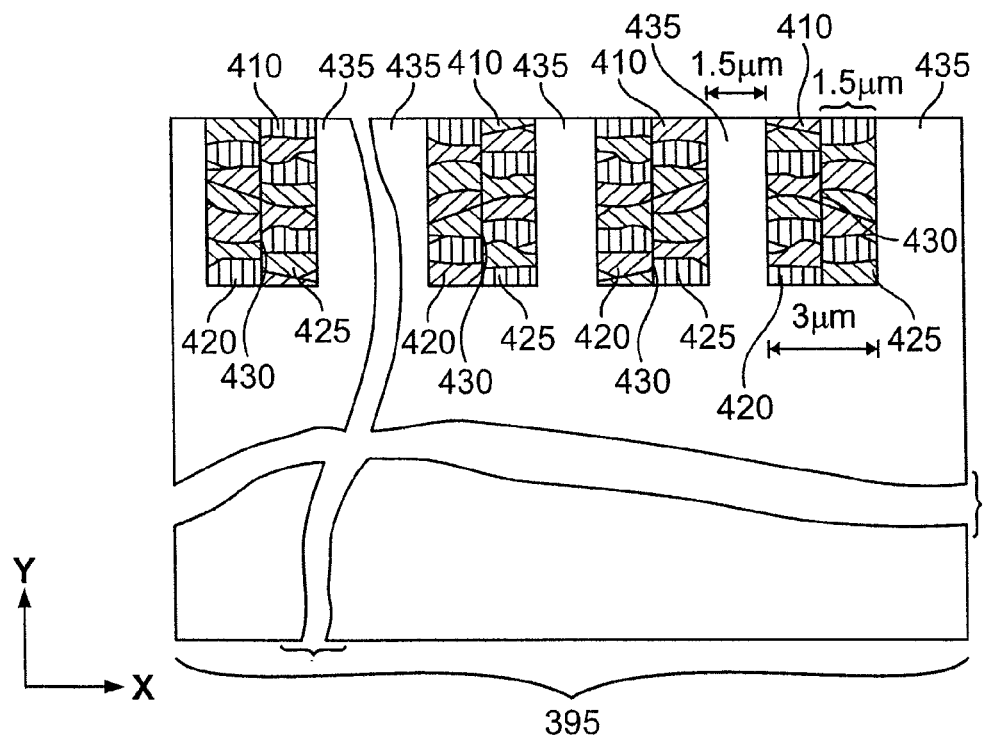

FIGS. 4A-4F illustrate the growing crystallization front with sequential irradiation according to the laser beam irradiation path shown in FIG. 3. The y- and x-axes orientations are as shown. FIG. 4A shows the irradiation and complete melting of areas 410 of the thin film 400 when the illumination pattern is at a first initial position 315. In one or more embodiments of the present invention, optionally only one-half of the mask is exposed onto the film surface (i.e., position 315) in the first laser beam pulse in order to avoid non-irradiated regions at the film edge. The regions 435 of the film correspond to the beam-blocked slit spacings 240 of the mask and therefore remain solid. In an exemplary embodiment, regions 410 have a width of about 3 μm and a slit spacing of about 1.5 μm. After the irradiation laser pulse, the first regions 410 rapidly cool and crystallize. Crystallization is initiated at solid boundaries of region 418 and proceeds inward to the center of region 410. As shown in FIG. 4B, region 410 crystallizes to form two crystallization growth fronts 420, 425 of elongated grains grown laterally towards one another from adjoining unmelted regions 435. The characteristic lateral growth length is a function of the film thickness, the substrate temperature, pulse duration, buffer layering, mask dimensions, etc. The two crystallization growth fronts 420, 425 abut one another along an abutment boundary 430 after the grains have grown laterally, e.g., about 1.5 μm in the current example.

The substrate is advanced a distance in the positive y-direction and the mask is translated a distance in the positive x-direction along irradiation paths 320 and 325, respectively, to arrive at a second position 315a with respect to the stationary laser beams. The timing of the laser pulse is controlled such that the translation of the mask and the substrate are complete at the time of the next laser beam pulse.

Figure 4C:
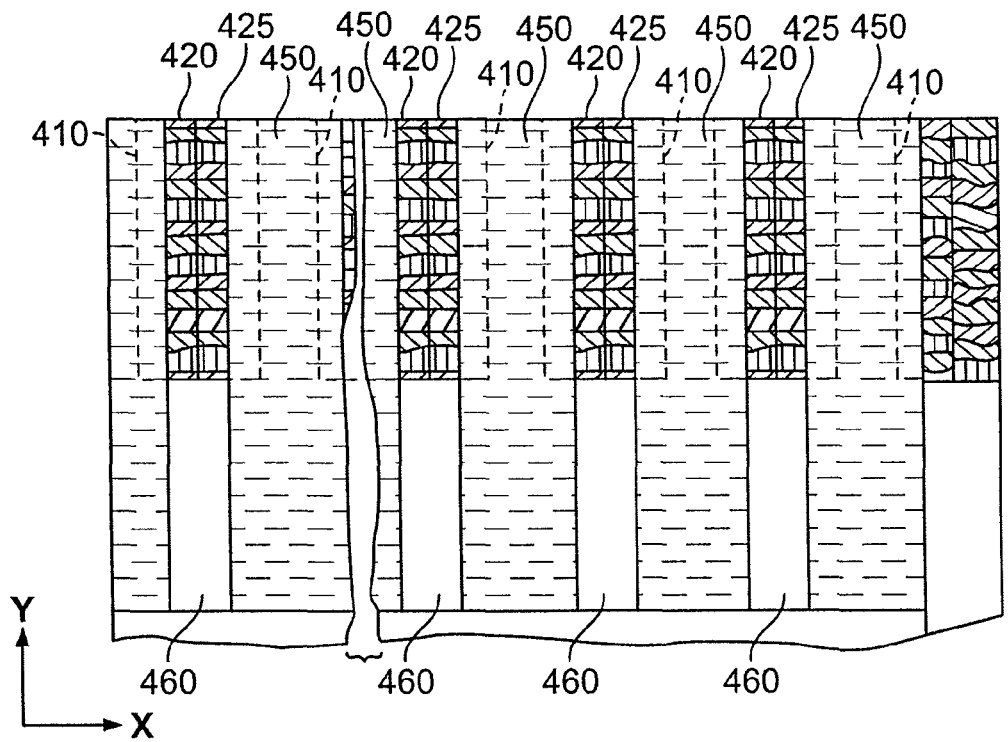

As shown in FIG. 4C, a second irradiation laser beam pulse irradiates and completely melts the substrate in second regions 450. Second regions 450 are offset from the first regions 410 (shown as dashed lines FIG. 4C) in the x-direction a distance so that the newly melted regions 450 are nested between and overlap slightly the first regions 410. The second regions 450 are also offset from the first regions 410 in the y-direction so that the newly melted regions 450 extend an additional distance in the y-direction beyond regions 410. The pulse frequency and translation speed (of the mask and sample) are controlled, e.g., by a computer, to provide the desired location and overlap of sequential irradiations. As shown in FIG. 4C, the crystallized regions 410 can act as seed crystals for crystallization of melted regions 450. The width of the overlap is small, and can be, for example, 0.5 μm, 1 μm, 1.5 μm, or greater. Overlap is sufficient to avoid unirradiated areas on the semiconductor film and to provide seed crystal for subsequent crystallization.

Figure 4D:
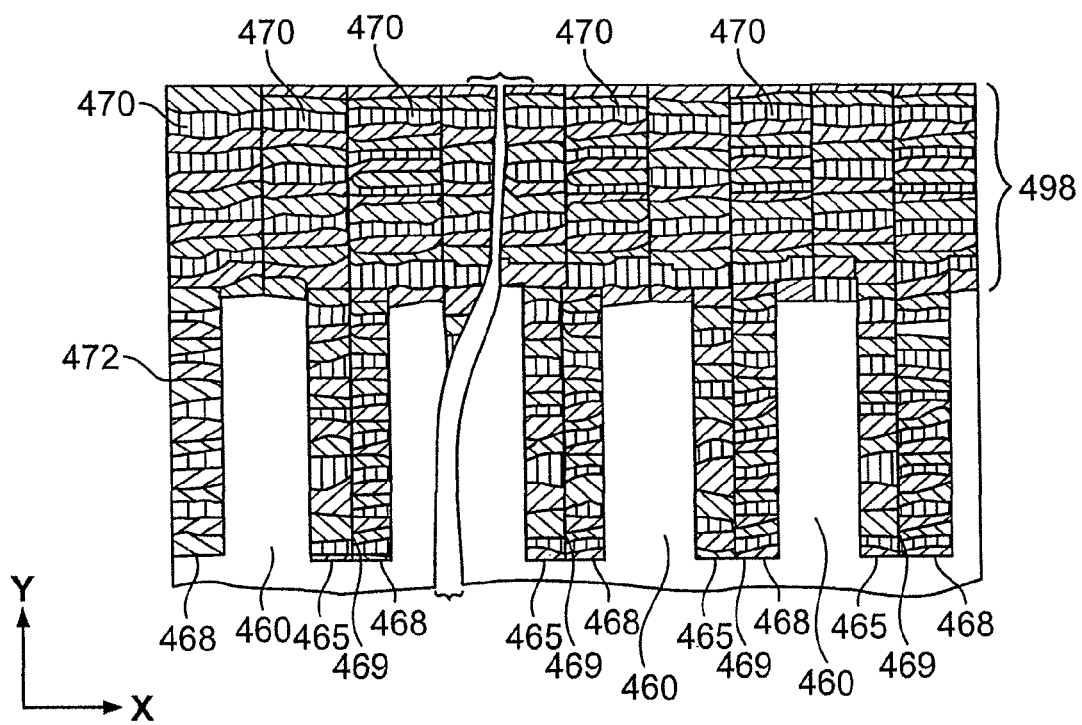

FIG. 4D shows the resultant microstructure of the film after cooling, resolidification and crystal growth of the completely melted regions 450 shown in FIG. 4C. The melted region 450 crystallizes to form two crystalline growth fronts 465, 468 that proceed towards each other from the adjoining non-irradiated regions 460 and crystallized regions 410. The two crystalline growth fronts abut one another along a grain boundary 469 after the grains have grown laterally. Furthermore, the grains grown from the region of the melt that is in contact with polycrystalline region 410 form elongated grains that are a continuation of the grains formed in region 410, resulting in crystallized regions 470 having significantly increased grain lengths, e.g., greater than the characteristic lateral growth length.

Figure 4E:
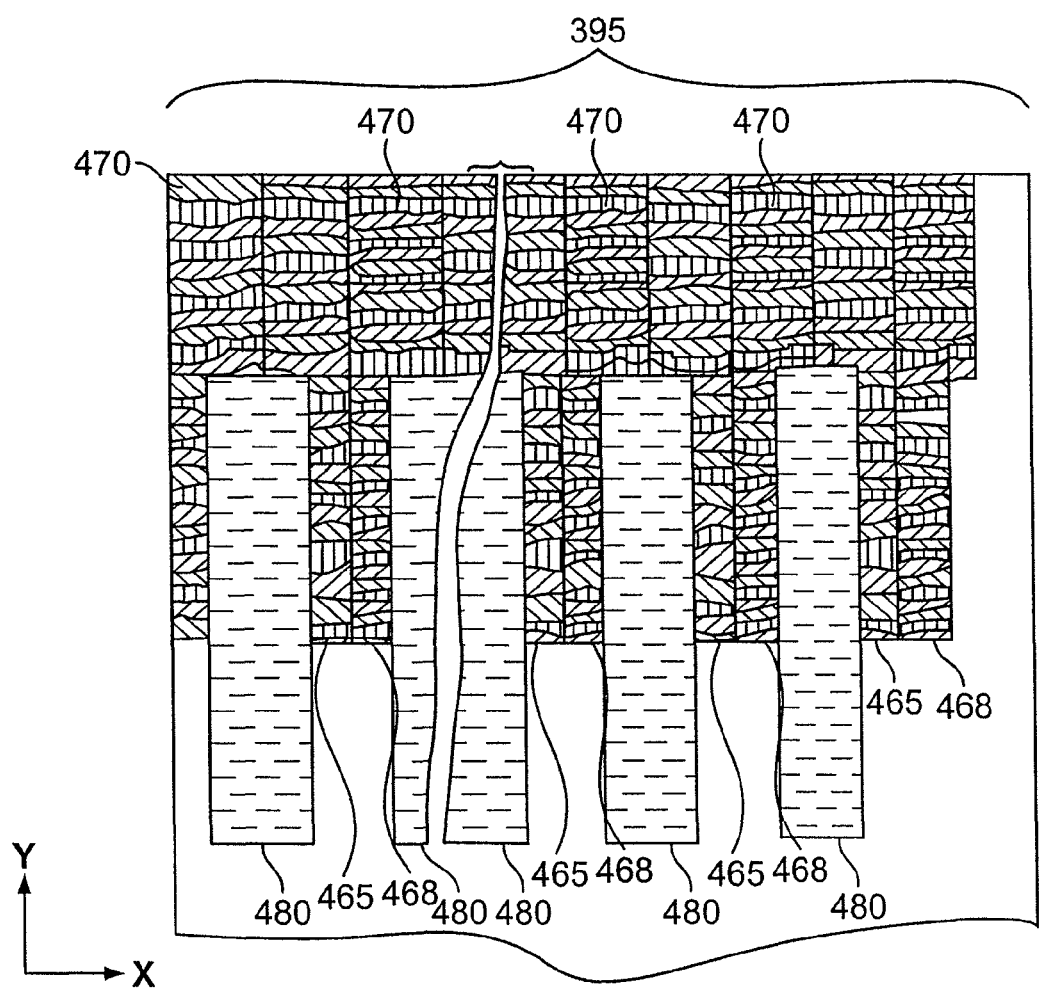

During and after crystallization of regions 450 (the time scale of solidification is about 1-10 μsec, while the interval between two laser pulses is a few msec), the substrate advances a distance in the y-direction and the mask is translated a distance in the negative x-direction along irradiation paths 320a and 325a, respectively, to arrive at a third position 315b with respect to the stationary laser beams, as shown in FIG. 4E. Because the y-axis translation distance over the previous two translations is less than l', the projected length of the mask slit, the third irradiation position 315b overlaps previously crystallized regions 410. The timing of the third laser beam pulse is controlled in a manner similar to the control of the previous first and second laser beam pulses, so as to coincide with the proper positioning of the sample and the mask at position 315b at the time of pulsing. The third laser beam pulse is generated to irradiate the sample substrate to form completely melted regions 480. As previously described, the translation provides overlapped areas to avoid non-irradiated regions and to provide grains as seed crystals for crystallization. The melted regions 480 resolidify and crystallize as described above.

Figure 4F:
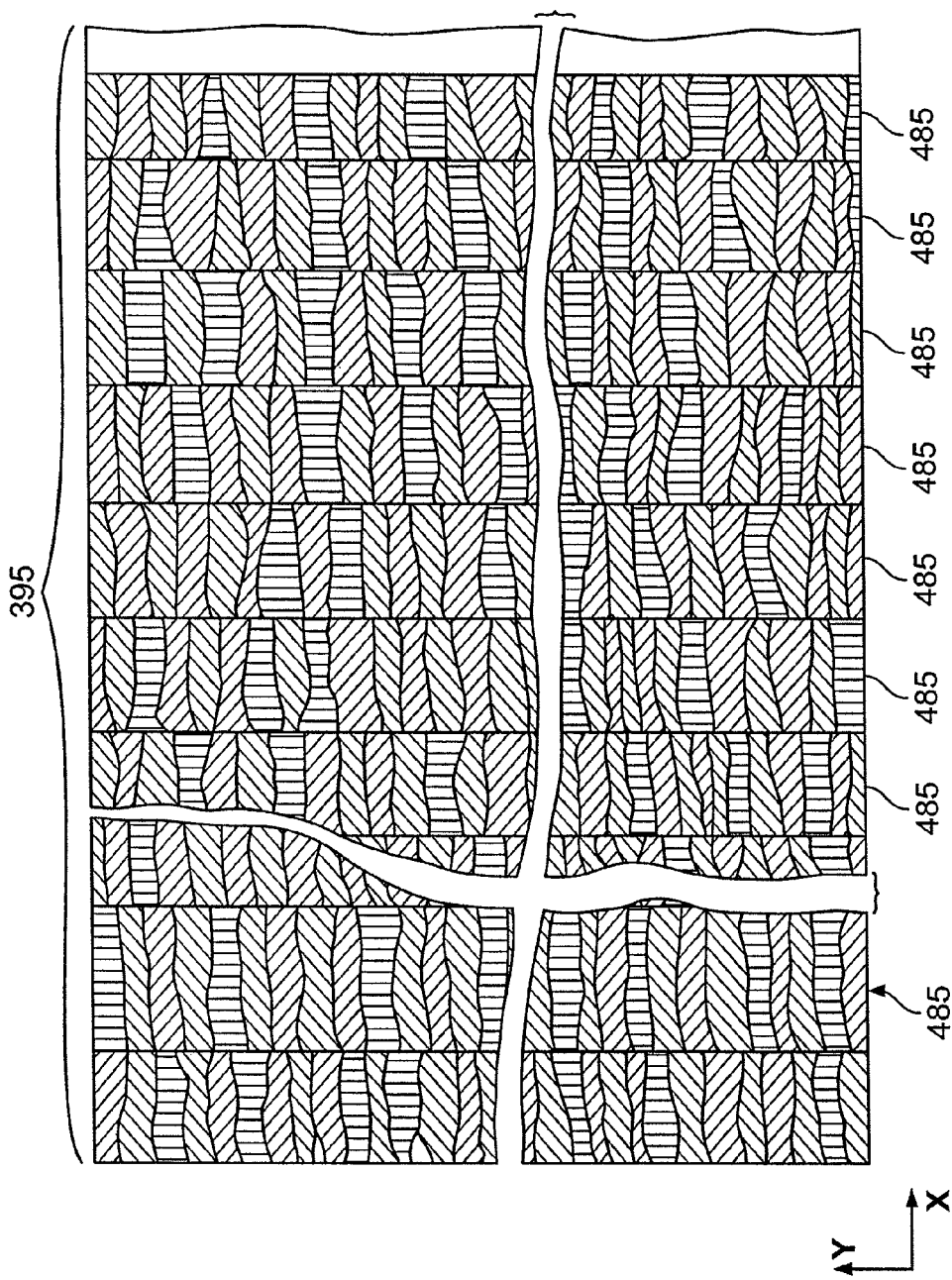

The substrate continues to advance along the irradiation path shown in FIG. 3, and the process of irradiation, melt and crystallization progresses along column 395. FIG. 4F shows resolidification regions 485, which form column 395 of the processed film containing contiguous parallel elongated grains having grain boundaries generally oriented in the x-direction. Column 395 is defined approximately by the distance of y-translation and the overall width of the mask. Note that this region has been fully crystallized in a single pass over the substrate surface.

Upon complete crystallization of column 395, the sample is translated along path 380 to a new position corresponding to column 395a of the sample. See FIG. 3. The process as described above can be repeated for column 395a, as is illustrated in FIG. 3, except that the sample now moves continuously across the film region to be crystallized in the reverse direction, e.g., in the −y direction, along irradiation path 340, 345, etc.

Figure 5:
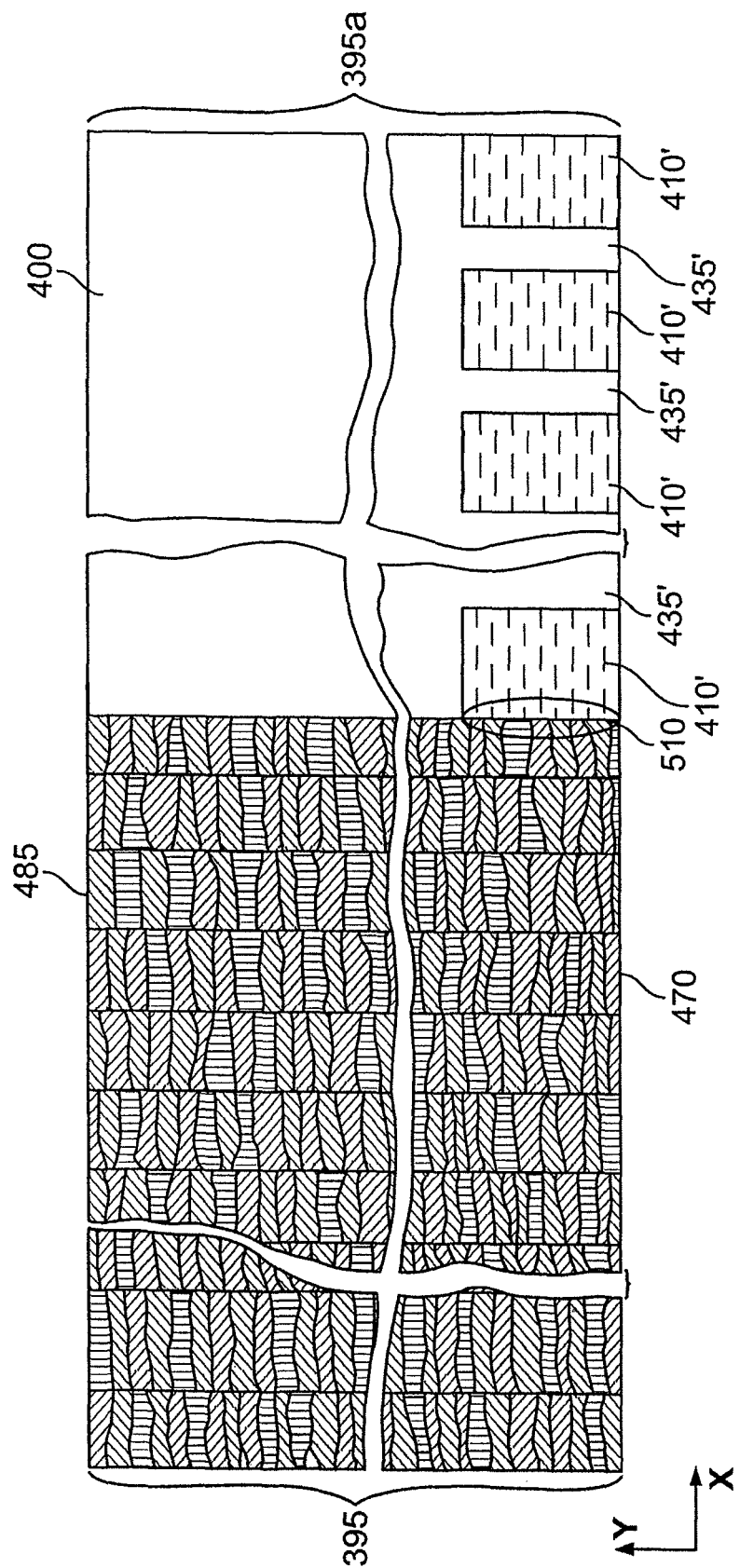
FIG. 5 illustrates the first step in the sequential lateral solidification of an exemplary second column of a sample having a film thereon.

FIG. 5 illustrates the first step in the sequential irradiation process for column 395a. The mask and substrate are in position to irradiate and melt a portion 410' of the film, while a portion 435' is not irradiated and remains solid. As discussed above, elongated grains (not shown) grow inwards towards one another from adjoining unmelted regions 435'. Also as described above, the substrate and mask translate along a specified pathway during pulsed laser irradiation of the film so as to crystallize a column of the film in a single scan across the film surface. The translation path overlaps somewhat with the previously crystallized column 395. The overlap region 510 between adjacent irradiation regions of the first and second columns extends crystal growth from the previously laterally grown crystals. In this manner, the entire surface of the semiconductor film is processed to provide a polycrystalline film having highly elongated grains terminating in a grain boundary that is substantially aligned with the y-axis.

Figure 6A:
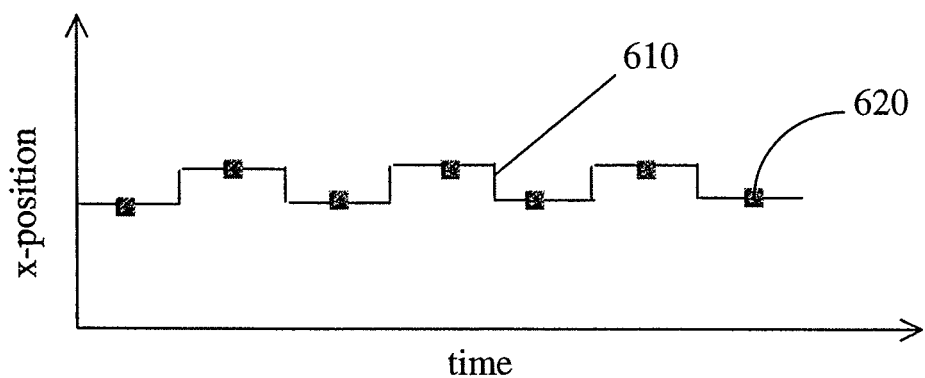
FIG. 6A illustrates the mask position during translation in the constant y-direction and oscillating x-direction as a linear step function.
Figure 6B:
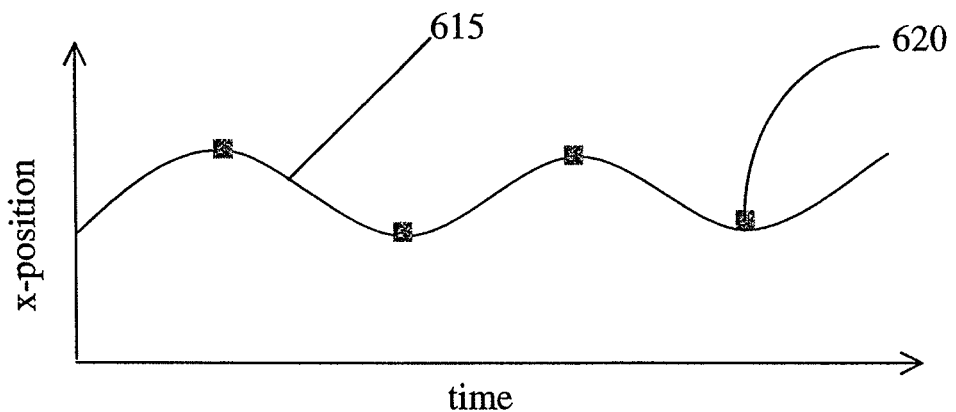
FIG. 6B shows the mask position during translation in the x- and y-directions as a sinusoidal function.

In one or more embodiments, the above process is characterized by mask oscillation between two x-axis positions, e.g., +x and −x, while the sample is continuously advanced in the same direction along the y-axis, e.g., +y. The exact mode of translation is not of great importance to the invention, so long as the distances in the x- and y-directions are carried out in coordination with the laser pulse frequency. Curves 610, 615 illustrate the x-position of the mask with time during stepwise (FIG. 6A) or continuous (FIG. 6B) translation, respectively. Thus, by way of example, the x-translation can be a step function as shown in FIG. 6A, or it can be continuous, e.g., a sinusoidal function, as illustrated in FIG. 6B. Other modes of translation are within the scope of the invention. Marks 620 on the x-translation curve indicate the mask position at the moment of laser irradiation, that is, the mask is substantially fully translated and in position at the time of laser irradiation.

Figure 6C:
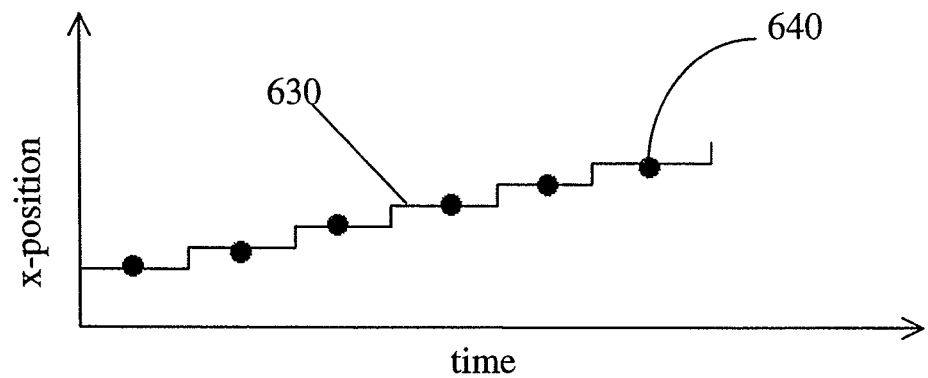
FIG. 6C shows the mask position during translation in constant x- and y-directions as a linear step function.
Figure 6D:
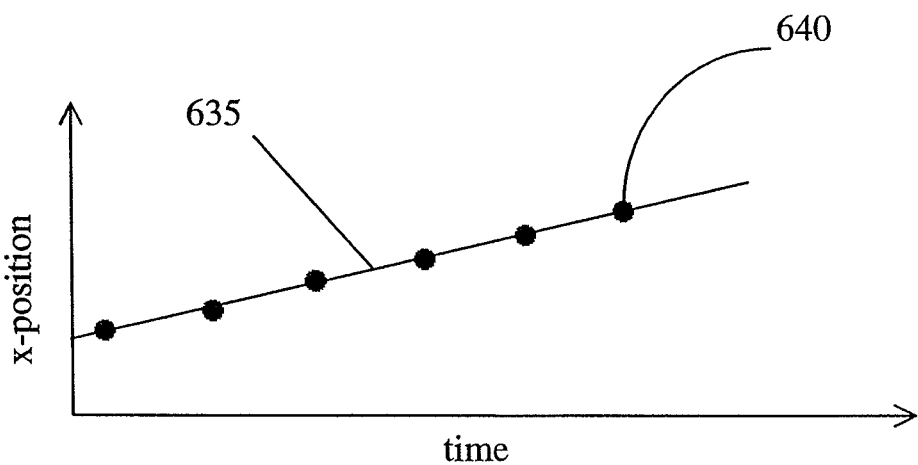
FIG. 6D shows the mask position during translation in constant x- and y-directions as a linear continuous function.

In one or more embodiments of the present invention, the mask is translated stepwise or continuously in a constant x-direction, while the sample is continuously moved in a y-direction. Curves 630, 635 show x-position of the mask with time during a stepwise (FIG. 6C) and continuous (FIG. 6D) process, respectively. Marks 640 indicate the x-position of the mask at the time of irradiation.

Although the x-axis oscillation introduces an additional process control step, it avoids the need to scan the same area of the substrate multiple times in order to fully crystallize the semiconductor film. Furthermore, it provides grains that are elongated beyond their characteristic lateral growth length, thereby further improving the crystalline properties of the polycrystalline film.

The foregoing examples describe an irradiation cycle consisting of two laser pulses and two x,y-translations, i.e., a cycle consisting of n pulses and n x,y-translations, where n=2. It is within the scope of the present invention to process a thin film using any number of sample and mask translation sequences to traverse an x-distance of about 2 and a y-distance of about l' (recall that l' is related to l, the length of the mask feature, by a demagnification factor of the laser optics). The value for n can vary widely, and can range, for example, from n=2-100. Without being bound by any mode or outcome of operation, higher n-values tend to provide films of higher crystallinity, longer grains and fewer grain boundaries.

In one or more embodiments, a process is provided to fully irradiate a subregion defined by a mask feature of dimensions w, d, and l using "n" laser irradiation pulses and "n" sets of x,y-translations, e.g., hereafter referred to as an "n-irradiation cycle." According to an exemplary embodiment, the sample moves a distance of about l'/n−δ in the y-direction between laser pulses. Translation distance of the mask in the x-axis between laser pulses is selected such that a total distance of λ is traversed over the sum of "n" cycles. Each x-translation can be the same or different, stepped or continuous. In one or more embodiments, each x-direction translation is substantially the same and can be λ/n. The selection criteria for the length and width of the mask features are similar to those described above for a mask used in the two-cycle irradiation process of FIGS. 4A-4F. However, the slit spacing between adjacent mask spacings can vary. In one or more embodiments, the slit spacing is greater than the slit width w. In one or more embodiments, the slit spacing and x-translation distance is selected to ensure x-direction overlap in sequential irradiation patterns.

Figure 7:
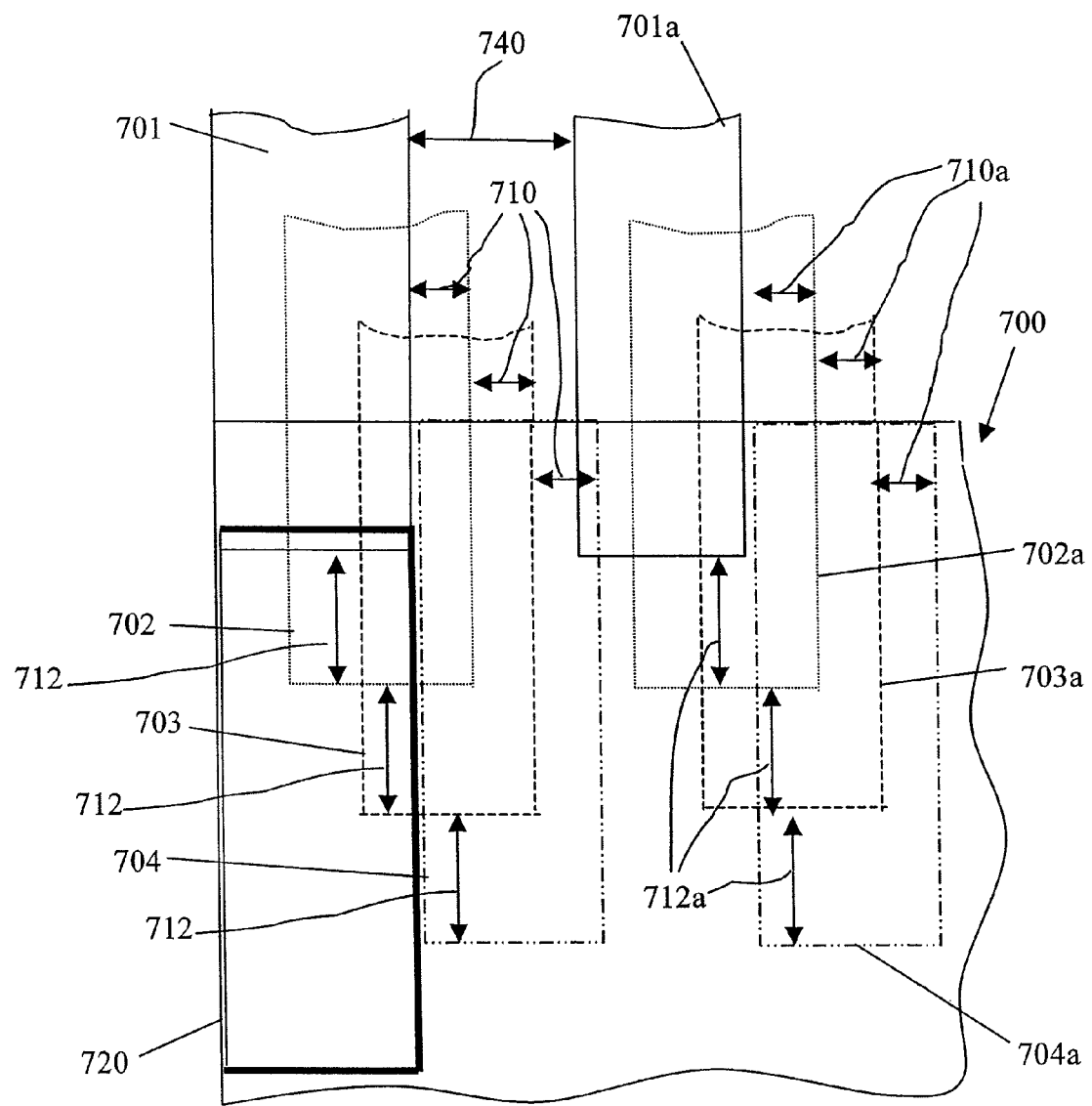
FIG. 7 illustrates a series of laser beam irradiation positions in a four-cycle (n=4) sequential lateral solidification process according to one or more embodiment of the present invention.

This process is illustrated schematically in FIG. 7, for the case where n=4. FIG. 7 depicts an enlarged portion of a film 700, which is irradiated by an irradiation pattern including at least two projected patterns 701, 701a spaced apart from each other by an exemplary spacing 740. The spacing 740 is not shown to scale; the spacing can be larger or smaller than shown. The sample is processed using a translation sequence that moves the sample a distance of l'−δ and the mask as distance of about λ during the time it takes for the laser to pulse four times. By way of example, the first irradiation pattern is at position 701, 701a (shown in FIG. 7 with solid lines), and the mask is offset to expose only a portion of the sample. The sample moves a distance of about l'/4−δ in the y-direction (indicated by arrow 712), and the mask is translated a distance of about λ/4 in the x-direction (indicated by arrow 710) to position 702, 702a (shown in FIG. 7 with dotted lines), where the sample again is irradiated and recrystallized. x,y-translation (λ/4, l'/4−δ), irradiation and crystallization continue through positions 703, 703a (shown in FIG. 7 with dashed lines) and 704, 704a (shown in FIG. 7 with dotted/dashed lines). Each irradiation and crystallization increases the grain length of the polycrystalline grains by using the previously crystallized grains as seed crystals for lateral grain growth. If the x-translation is selected to be less than the lateral growth length of the semiconductor grains, then extremely long grains can be obtained. Once the mask has translated a distance of about λ in the x-direction and the sample has translated a distance of l'−δ in the y-direction, the sample and the mask are repositioned to irradiate the next region of the sample. For example, the mask is translated a distance of about −λ in the x-direction; and the sample is translated a distance of about l'/4 in the y-direction to reposition the sample at location 720 (shown in FIG. 7 with bold lines), where the crystallization process is repeated. In the above exemplary process, distances of about λ and about l' are traversed in an n=4 irradiation cycle. It will be immediately apparent to those of skill in the art that any value of 'n' can be employed and that the translation distances are adjusted accordingly.

Figure 8:
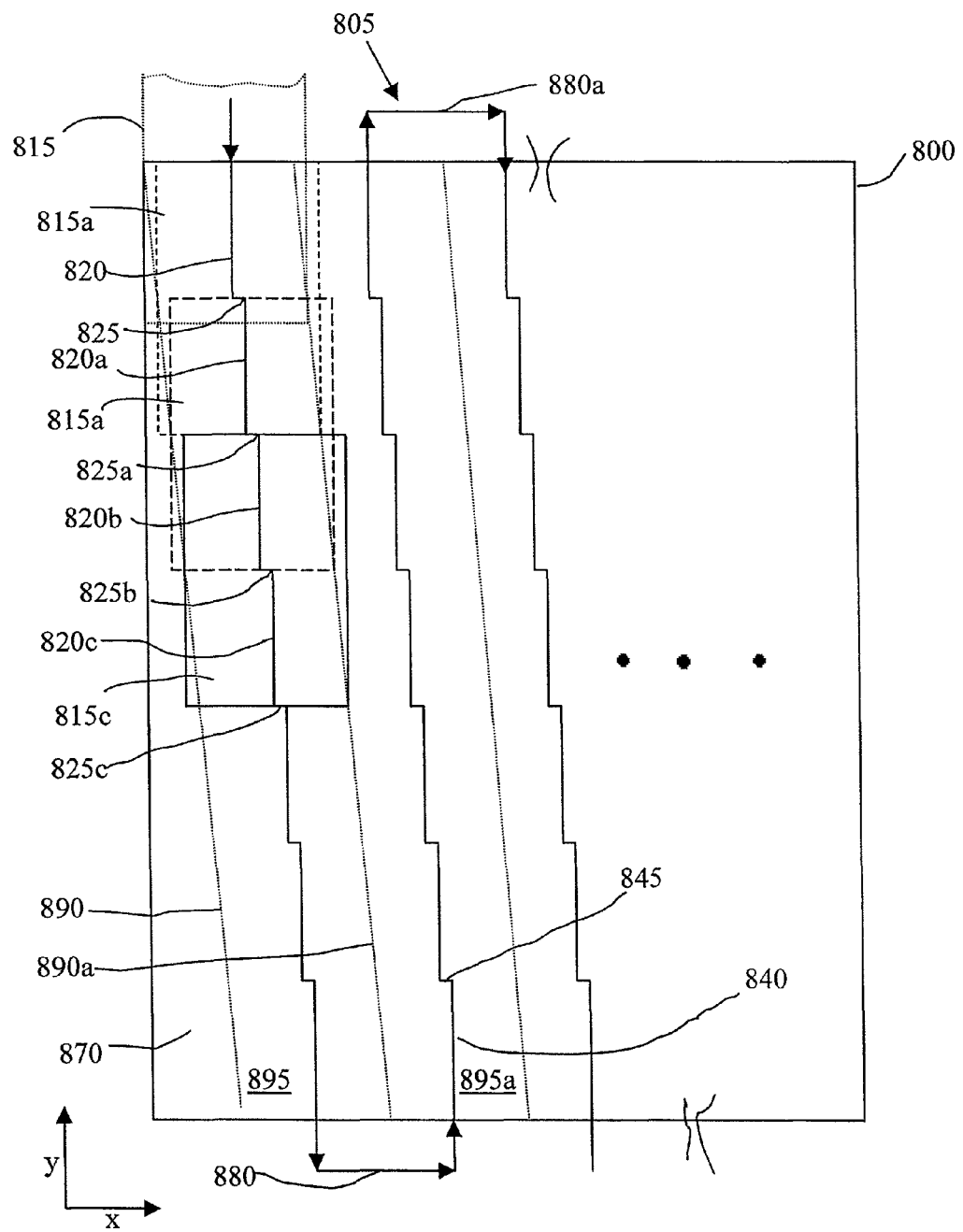
FIG. 8 shows another exemplary irradiation path of laser beam pulses on a sample surface as the sample is processed using the system of FIG. 1.

A crystallized column can also be generated using stepwise or continuous movement of the mask in a constant x-direction. By way of example, FIG. 8 illustrates an irradiation path 805 that can be obtained using a constant x-direction translation of the mask. Each set of x,y-translations shifts the irradiation path in the direction indicated by lines 825, 825a, 825b, etc., so that the resulting crystallized regions advance in a constant x (and y) direction across a film surface 800. In contrast to an oscillating mask translation, which provides columns of elongated crystals oriented along (parallel to) the long dimension (y-axis) of the substrate, a constant x-direction translation results in tilted or diagonal columns 895, 895a (defined by imaginary lines 890, 890a) that "walk across" the substrate surface at an angle. Crystallization proceeds in a manner similar to that shown in FIGS. 4A-4F for an oscillating mask translation process, with the exception that the irradiation pattern is incrementally offset in a constant x-direction.

In an exemplary process, the sample and the mask are positioned to provide an illumination pattern at an initial position 815 (shown by dotted lines in FIG. 8), where the pulsed laser beam passing through a mask generates a first intensity pattern on the film. As discussed above for oscillating mask translation, only a portion of the mask is used for the first irradiation step. The sample then moves a distance 820 in the positive y-direction, e.g., l'/2−δ, where l' is a function of the length of the mask feature and the demagnification factor of the laser optics and δ is a small value to ensure that the intensity patterns overlap from one irradiation position to the next; and the mask translates a distance 825 in the positive x-direction, e.g., about ½λ, where λ=w+d. As in the case of an oscillating mask translation, x- and y-translation can occur sequentially, in any order, or simultaneously.

The mask and sample move to position 815a (shown in FIG. 8 by small dashed lines) in time for a second laser beam pulse, which generates a second intensity pattern on the film. The substrate continues to move in the positive y-direction along path 820a and the mask continues to translate in the positive x-direction along path 825a to arrive at position 815b (shown as large dashed lines in FIG. 8). x,y-translation continues in this manner along path 820b, 825b, and 820c, 825c, etc. until the substrate reaches a predetermined endpoint. Thus, the irradiation path for column 895 is characterized by continuous motion of the substrate in the positive y-direction and continuous translation of the mask in the positive x-direction. When the scan of the first column is complete, the substrate is repositioned by moving the substrate and/or mask along the path defined by arrows 880. Translation of the substrate and mask in the return direction, e.g., along irradiation path 840, 845, etc., concurrent with irradiation of the film, occurs to crystallize column 895a. Because the resultant crystallized columns are not parallel to the sample edge, a lower left-hand region 870 (and a corresponding upper right hand region) is not crystallized during the process. If it is desired to crystallize region 870, the region is crystallized in a separate irradiation step using an irradiation pathway similar to that already described.

In other exemplary embodiments, the irradiation/crystallization sequence is carried out over "n" cycles, as described above for the oscillating mask process. 'n' can range, for example, from about 2 to 100, or more.

Figure 9:
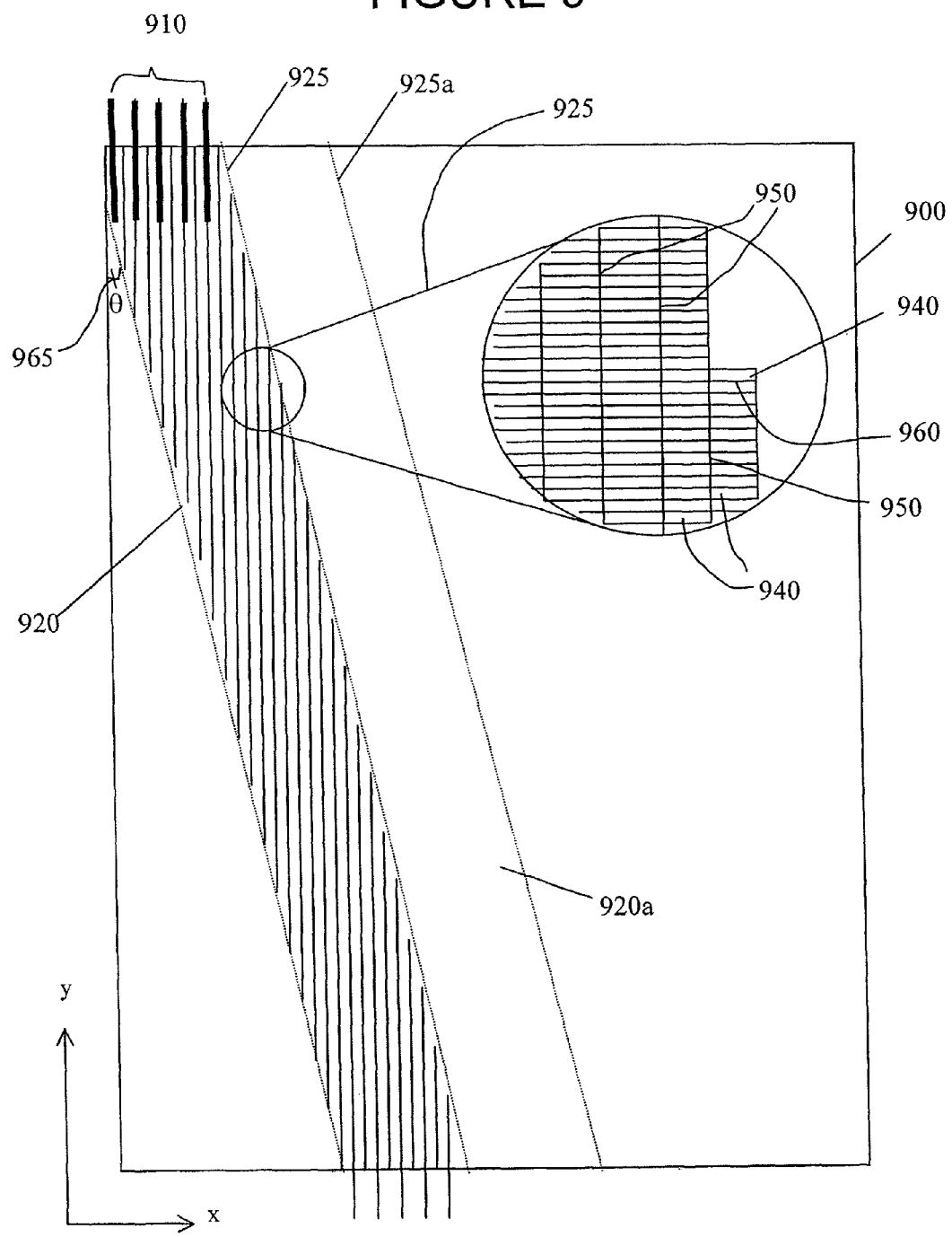
FIG. 9 is a schematic illustration of an irradiation pattern and resultant polycrystal grain formation according to one or more embodiments of the present invention during sequential laser beam processing on an exemplary first column of a sample having a film thereon.

With reference to FIG. 9, crystallization of a film 900 is shown using mask translation in the constant x-direction. Irradiation of a laser beam through a mask having five (5) slits produces an irradiation pattern 910 (indicated by bold lines in FIG. 9). Note that the x and y direction are not drawn to scale and that the length can be greater than actually shown. Further, slits typically may be wider than shown. The irradiation pattern steps across the sample to form a crystallized column 920, 920a, etc., which extends the length of the irradiated section (shown bounded by imaginary boundary 925, 925a, etc.). An enlarged portion of column 920 is shown in inset 925, which serves to illustrate the grain growth and orientation. Column 920 contains contiguous, elongated crystal grains 940 bounded by long location-controlled grain boundaries 950 that are generally parallel to the y-direction of translation. Individual elongated grains 940 also have substantially parallel grain boundaries 960 that are generally oriented in the x-direction. Due to the constant step in the x-direction, columns 920 are tilted with respect to the sample edge (and the y-translation axis) at a tilt angle θ 965. The magnitude of θ is a function of the x,y-translation of the substrate and mask.

The crystallization pattern such as shown in FIG. 9 results when the edges of the substrate are aligned with the x- and y-translation axes. Alternatively, the substrate can be positioned on the movable table so that it is at an angle with respect to the x- and y-translation axes, that is, the edges of the substrate (or imaginary edges in the case of a round or irregularly shaped substrate or subregion of the film) are tilted at an angle ϕ with respect to the x- and y-translation axes. The orientation difference between the x- and y-translational axes and the substrate, e.g., the misalignment angle, provides an additional degree of control over the location and orientation of polycrystals grown in the crystallization process according to one or more embodiments of the present invention.

Figure 10:
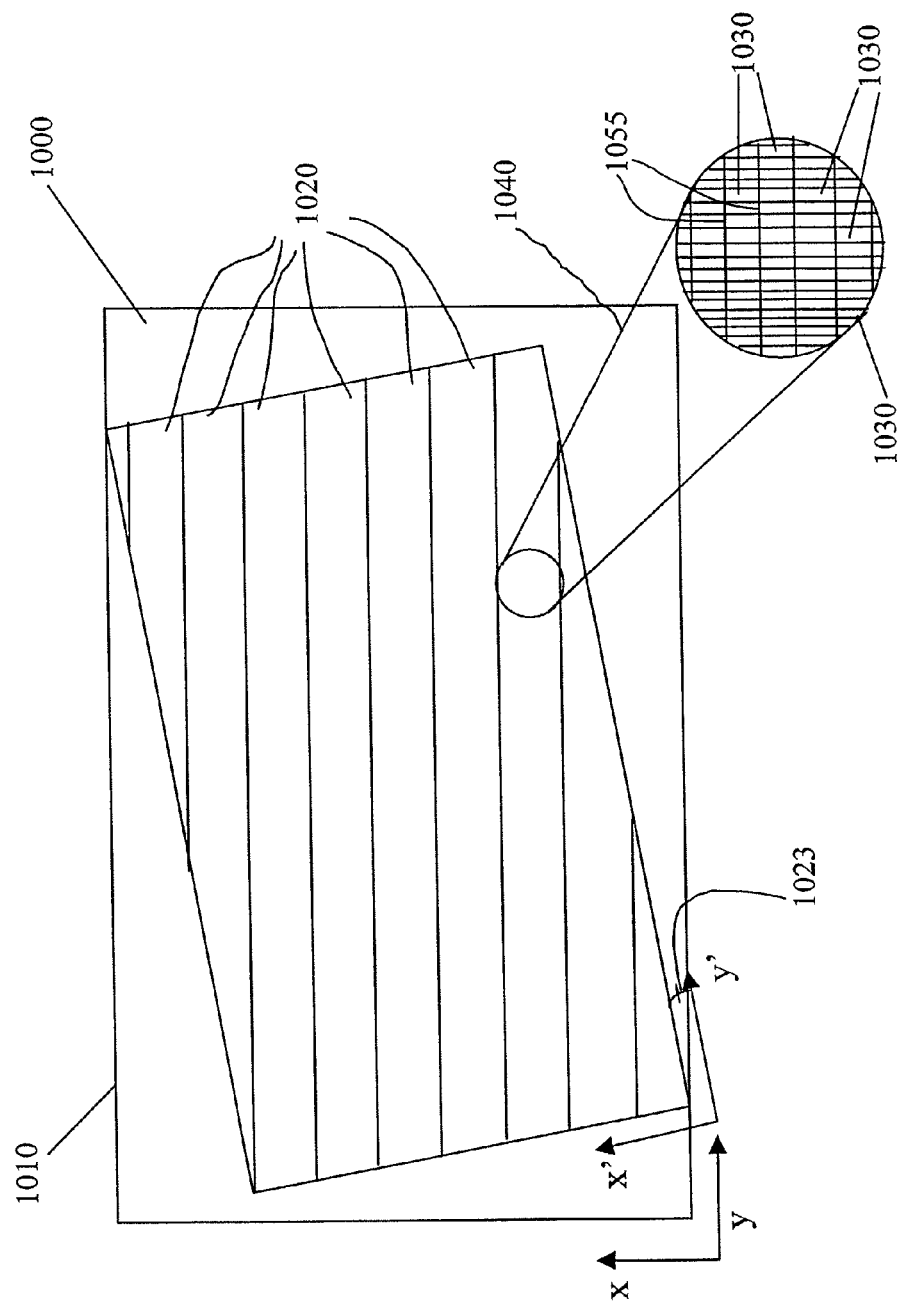
FIG. 10 is a schematic illustration of a film processed according to one or more embodiments of the present invention in which the substrate is positioned along x'- and y'-axes and is offset from the x- and y-axes of translation during sequential laser beam irradiation. The irradiation sequence includes oscillation of the mask in the ±x-directions.
Figure 11:
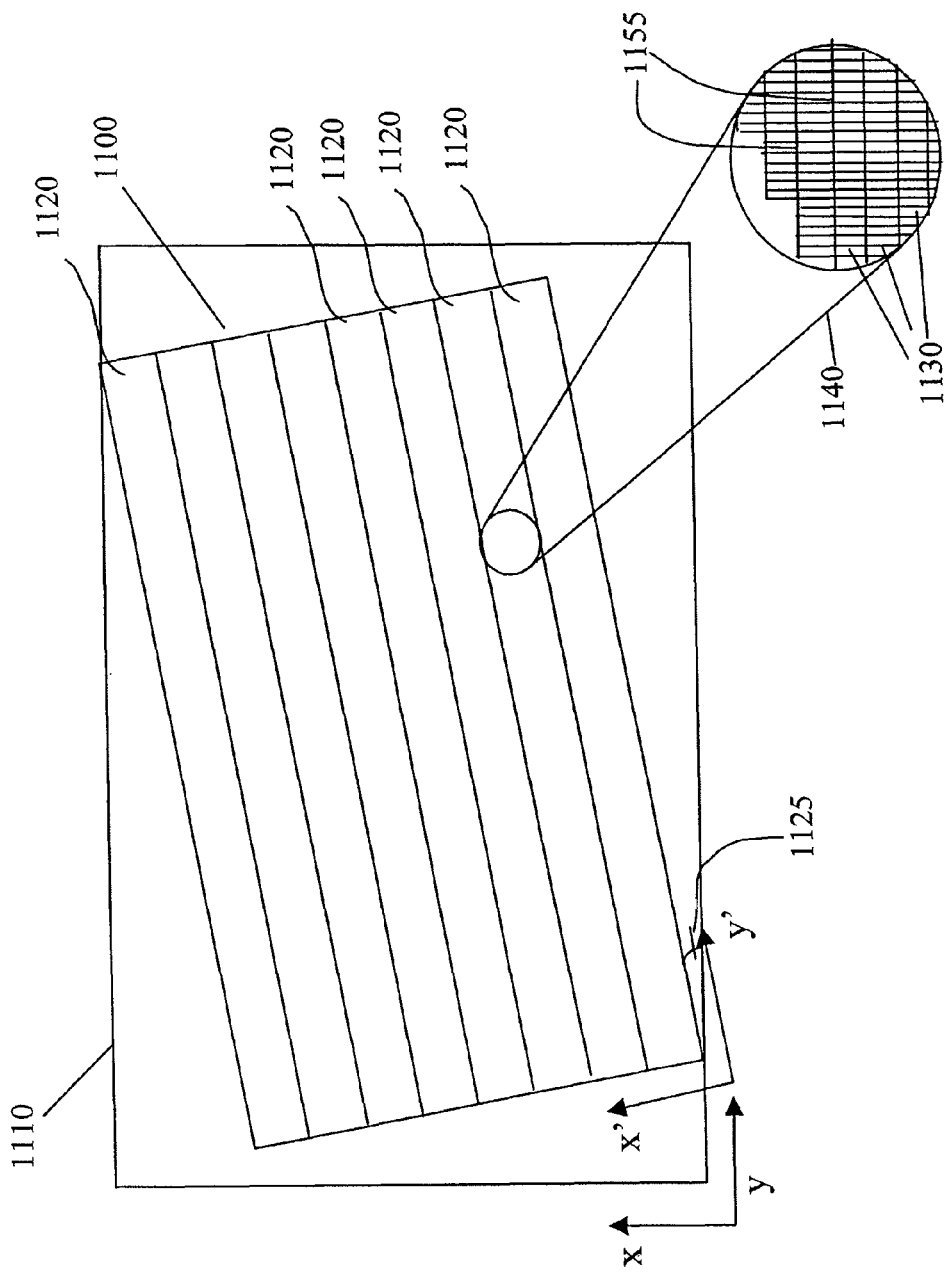
FIG. 11 is a schematic illustration of a film processed according to one or more embodiments of the present invention in which the substrate is positioned along x'- and y'-axes and is offset from the x- and y-axes of translation during sequential laser beam irradiation. The irradiation sequence includes translation of the mask in a constant x-direction.

FIGS. 10 and 11 illustrate various methods and crystallization patterns that may be obtained using a single scan irradiation process on substrates that are misaligned with the translation axes.

FIG. 10 is a schematic illustration of a crystallized film 1000 that has been processed using an oscillating mask translation process, that is, where the mask oscillates in the positive and negative x-directions. The substrate (with film) is placed on stage 1010 along x'- and y'-axes that are at an angle ϕ (indicated by arrow 1023) with respect to the x- and y-translation axes. As used herein, x,y-misalignment is a measure of the difference between the x-y-translational axes and the real (or imaginary) x',y'-axes defining the substrate edges. The film is processed in an oscillating mask translation process such as is described above (see, e.g., FIGS. 3-5), resulting in a crystallized film containing columns 1020 that are parallel to the y-axis of translation, but offset from the substrate y'-axis of the film substrate at an angle commensurate with angle ϕ, the angle of x,y-misalignment. Inset 1040 illustrates the crystalline grain structure of the film in greater detail. Although columns 1020 form diagonally across substrate 1000, the location-controlled grain boundaries 1055 of elongated crystal grains 1030 form parallel to the y-translation axis.

An alternative crystalline grain structure is obtained when the mask is translated in a constant x-direction. FIG. 11 is a schematic illustration of a crystallized film 1100 that has been processed using constant x-translation of the mask on a substrate that is aligned along axes x' and y' and offset from the x- and y-translational axes by an angle, ϕ. The substrate (with film) is placed on a stage 1110 along x'- and y'-axes that are at an angle ϕ with respect to the x- and y-translation axes. In one or more embodiments where the angle ϕ of x,y-misalignment (indicated by arrow 1125) is of the same magnitude as the tilt angle θ (see, FIG. 9 and related discussion above), the resultant columns 1120 are parallel to the x'- and y'-axes of the substrate. Thus, by way of example only, if the column tilt angle θ is 10°, and the substrate is rotated at a misalignment angle ϕ of 10°, then the resultant polycrystalline columns 1120 are substantially parallel to the y'-axis. Although columns 1120 run parallel to the substrate y'-axis, the elongated grains contained within the columns nonetheless remain oriented relative to the x,y-translation axes. Thus, the elongated crystal grains 1130 (shown in inset 1140) contain location-controlled grain boundaries 1155 that are substantially parallel to the y-translation axis. Although columns 1120 are substantially parallel to the substrate edge, the grains contained therein are referred to as "tilted" because the long location-controlled grain boundary 1155 is not parallel to the substrate edge.

Tilted grains find many applications in fabrication of micro-electronic devices, for example, in the formation of thin film transistors (TFT) having active channel regions with uniform performance. The performance of a TFT depends, in part, on the electron mobility of the semiconductor polycrystalline layer, which depends, in part, on the number of grain boundaries in the TFT active channel. There will be certain device orientations where optimization of device uniformity (rather than device performance) is desired. In a tilt-engineered device, each thin film device is tilted (relative to the substrate edge) so that the same number of perpendicular grain boundaries is found in the active channel region. Each device, therefore, has comparable mobilities and performances. For example, co-pending International Application Serial Number PCT/US02/27246, filed Aug. 27, 2002, and entitled "Method to Increase Device-To-Device Uniformity for Polycrystalline Thin-Film Transistors by Deliberately Misaligning the Microstructure Relative to the Channel Region," recommends that the TFT active channel is placed at an angle relative to the long location-controlled grain boundaries of the semiconductor film. However, forming TFT active channels (which typically involves conventional semiconductor fabrication steps such as patterning and ion implantation) at such irregular angles is inefficient and not easily integratable into standard fabrication processes.

Figure 12:
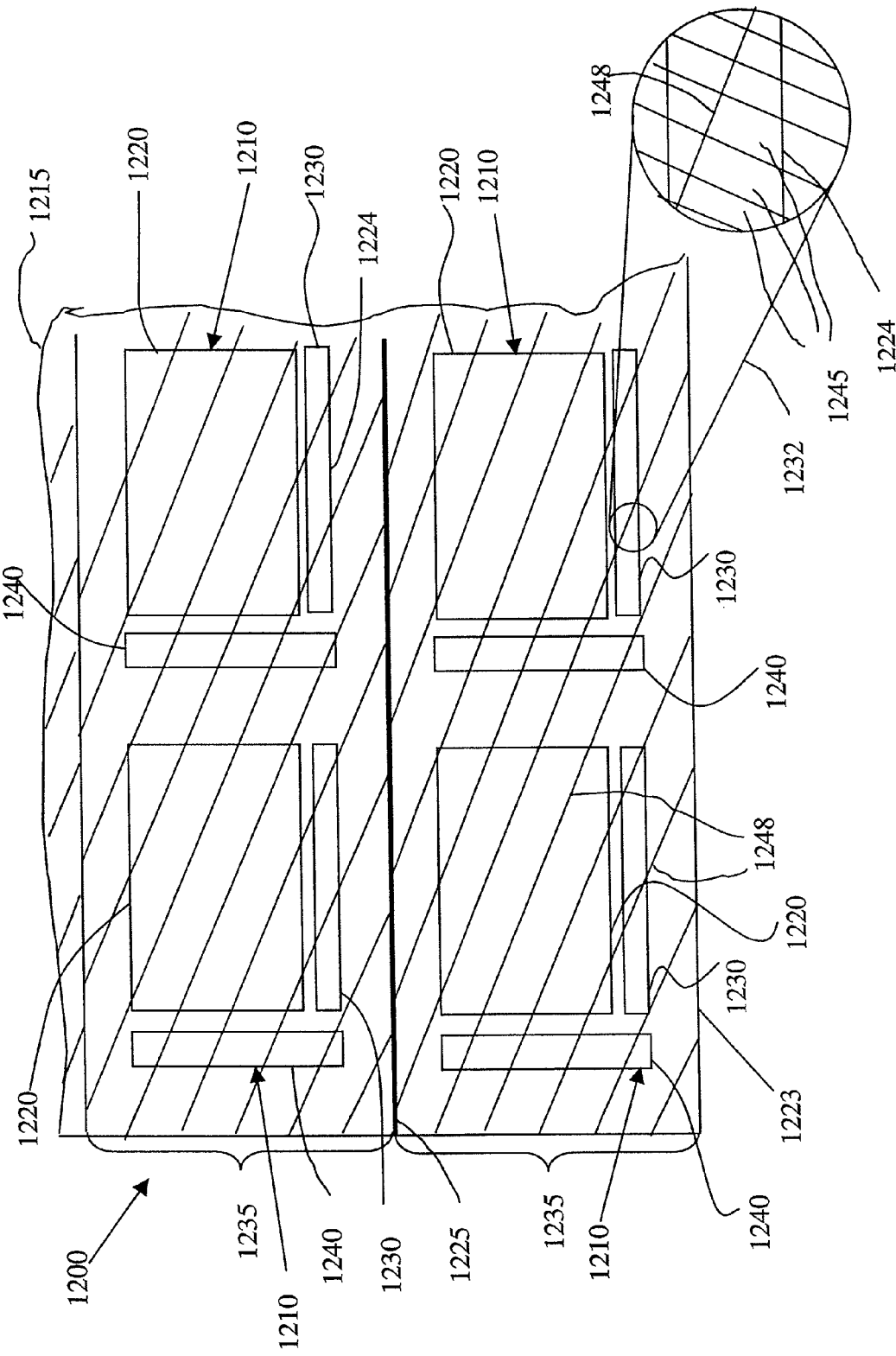
FIG. 12 is a schematic illustration of a TFT device having integration regions and pixel regions positioned at an angle with respect to the long, location-controlled grain boundaries of the polycrystalline film.

According to exemplary embodiments of the present invention, a TFT device contains active channels arranged at regular and ordered intervals, while maintaining a desired tilt angle of the location-controlled grain boundaries. FIG. 12 illustrates a microelectronic device 1200 including a number of TFT devices 1210 formed on a silicon polycrystalline film 1215. Each TFT device contains a pixel control area 1220, a row integration region 1230 and a column integration region 1240. The TFT device is typically formed in the semiconductor film using a series of well-known, conventional ion implantation and patterning methods. Stitch line 1225 denotes an imaginary boundary between adjacent polycrystalline columns 1235, where each column is formed in a continuous scan of the sample by the patterned laser beams. Note that the edge 1224 of the TFT device is in alignment with the film edge 1223 and stitch line 1225, but that edge 1224 is tilted with respect to the location-controlled grain boundary 1248. As shown in greater detail in inset 1232, column 1235 contains polycrystalline grains 1245 having a location controlled grain boundary 1248 that is at a tilt angle θ with respect to the edges of the TFT device 1224. See, e.g., FIG. 11 and its discussion, above. Thus, a plurality of TFT devices 1210 are formed at regular and ordered intervals across the film substrate. The TFT devices are substantially aligned with the film edge 1223 and/or the stitch line 1225 of the polycrystalline film; however, the TFT devices 1210, and in particular, the integration regions 1230 and 1240, are tilted at an angle with respect to long location-controlled grain boundaries 1248 of the polycrystals. This represents a significant improvement in device uniformity without increase in fabrication costs.

Figure 13A:
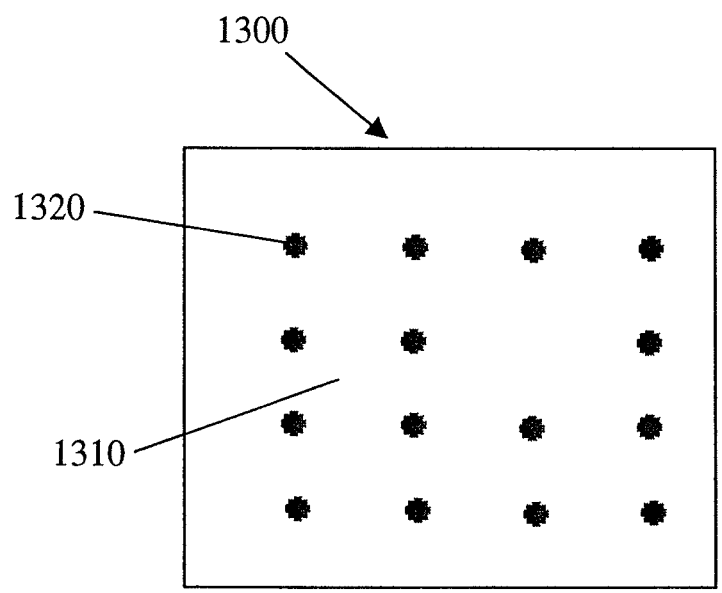
FIG. 13A is a schematic illustration of a mask to be used in one or more embodiments of the present invention.

FIG. 13A illustrates another exemplary mask that is used in one or more embodiments of the present invention. Mask 1300 is an inverted mask where regions or "dots" 1320 correspond to the laser-opaque, masked region and the remainder of the mask 1321 is laser-transparent. Upon irradiation, all but the regions masked by 1320 melt, and the solid islands serve as seeding sites for lateral crystal growth. The size and location of dots 1320 are selected so that the laterally grown regions overlap between successive irradiations.

Figure 13B:
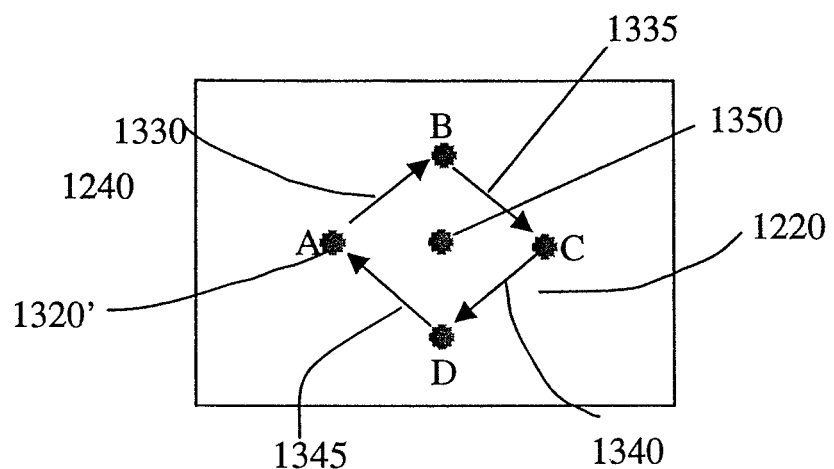
FIG. 13B is a diagram illustrating a mask translation pattern for the mask of FIG. 13A, and FIGS. 13C and 13D illustrate the x-position and y-position, respectively, of the mask during the translation pattern of FIG. 13B.

In one or more embodiments of the present invention, a film is crystallized using an inverted masked 1300 such as the one shown in FIG. 13A, where opaque regions 1320 correspond to the masked region and the remainder of the mask 1310 is transparent. The mask 1300 is sequentially translated in both the x- and y-directions about an imaginary central point 1350 on the sample as shown in FIG. 13B. The mask sequence is described as a series of motions of opaque region 1320', however, it is understood that the entire mask, which may contain a plurality of opaque regions, is moving in the sequence described.

Figure 13C:
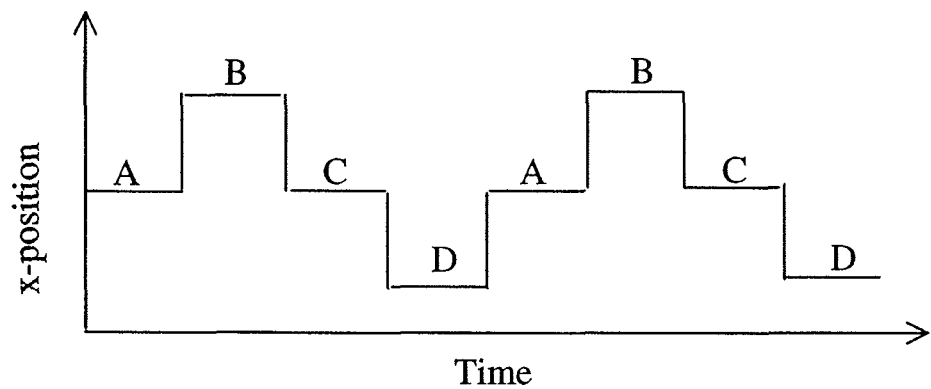
Figure 13D:
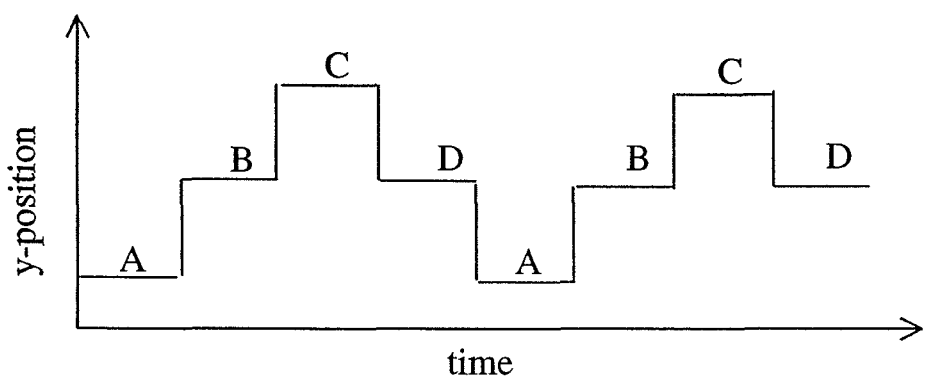

With reference to FIG. 13B, the film is irradiated with a first laser pulse while the mask is at position A. Region 1320' then is translated a short distance 1330 in the x,y-directions from its original position A to a new position B. After a second laser pulse at position B, the mask is translated a second distance 1335 in the x,y-direction to arrive at position C. After a third laser pulse while at position C, the mask then translates a third distance 1340 to arrive at position D. A final x,y-translation 1345 returns the mask region 1320' to its original position A. The x- and y-coordinates of opaque region 1320' at each position are shown in FIGS. 13C and 13D, respectively. During the sequential movement of the mask, the substrate moves in a constant y-direction.

Figure 14:
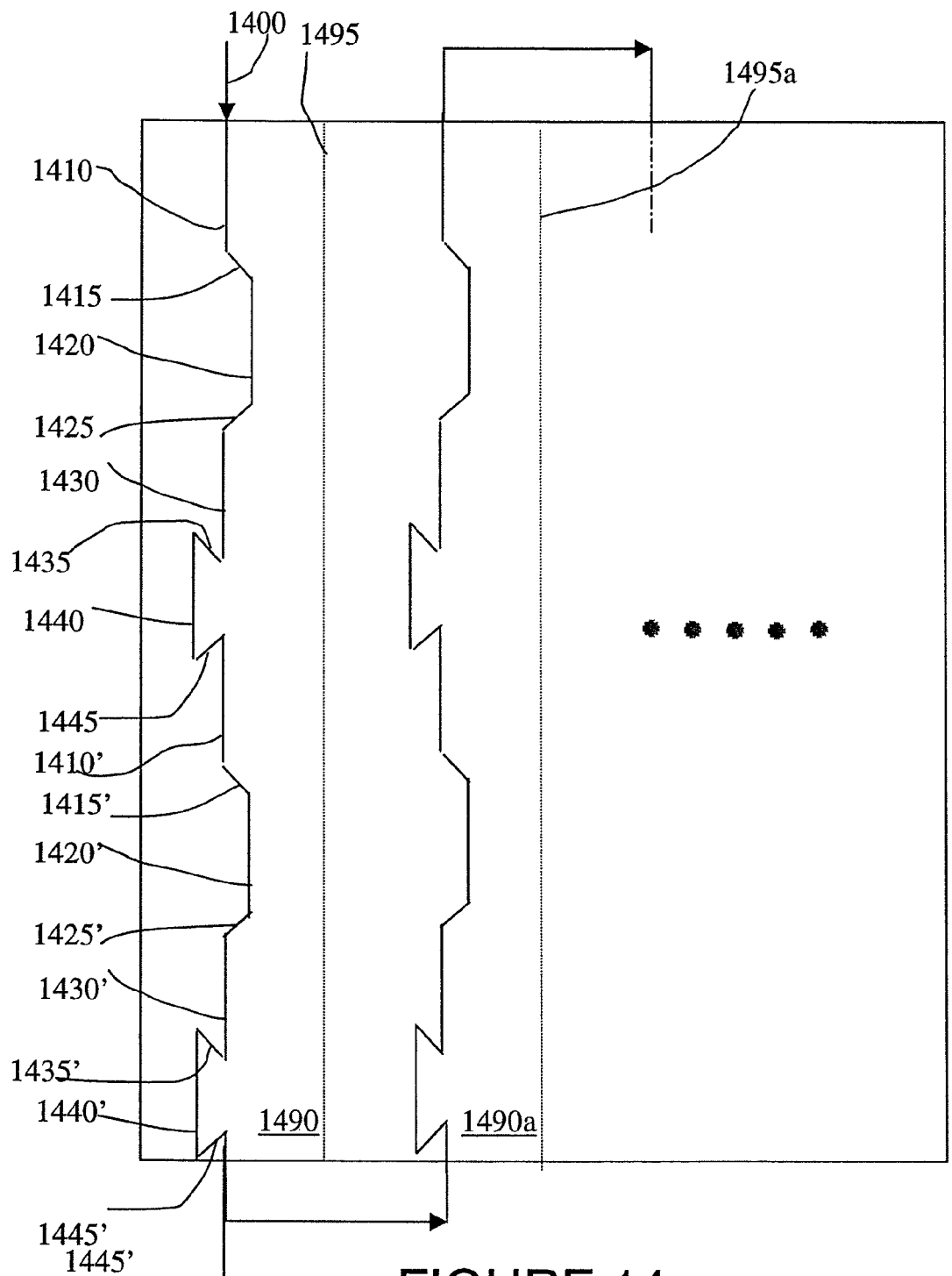
FIG. 14 is a schematic illustration of an irradiation pattern according to one or more embodiments of the present invention during sequential laser beam processing using a mask pattern shown in FIG. 13A and a mask translation pattern shown in FIG. 13B.

FIG. 14 illustrates an irradiation sequence using mask 1300 according to one or more embodiments of the invention. The mask and the stage on which the sample is located are translated to provide an illumination pattern 1400. The irradiation path 1400 indicates the path of the laser beam pulses as the substrate and the mask are translated in the x- and y-directions relative to a stationary laser beam. Arrows indicate the direction (and sequence) of translations. The translations are accomplished by the coordinated movement of the film-bearing substrate (on a movable stage) and the mask. Dashed lines 1495, 1495a, etc. define imaginary columns 1490, 1490a, etc. on the substrate surface, each of which is irradiated and crystallized in a single traversal of the laser across the substrate surface (or a selected region of the substrate surface).

Figure 15:
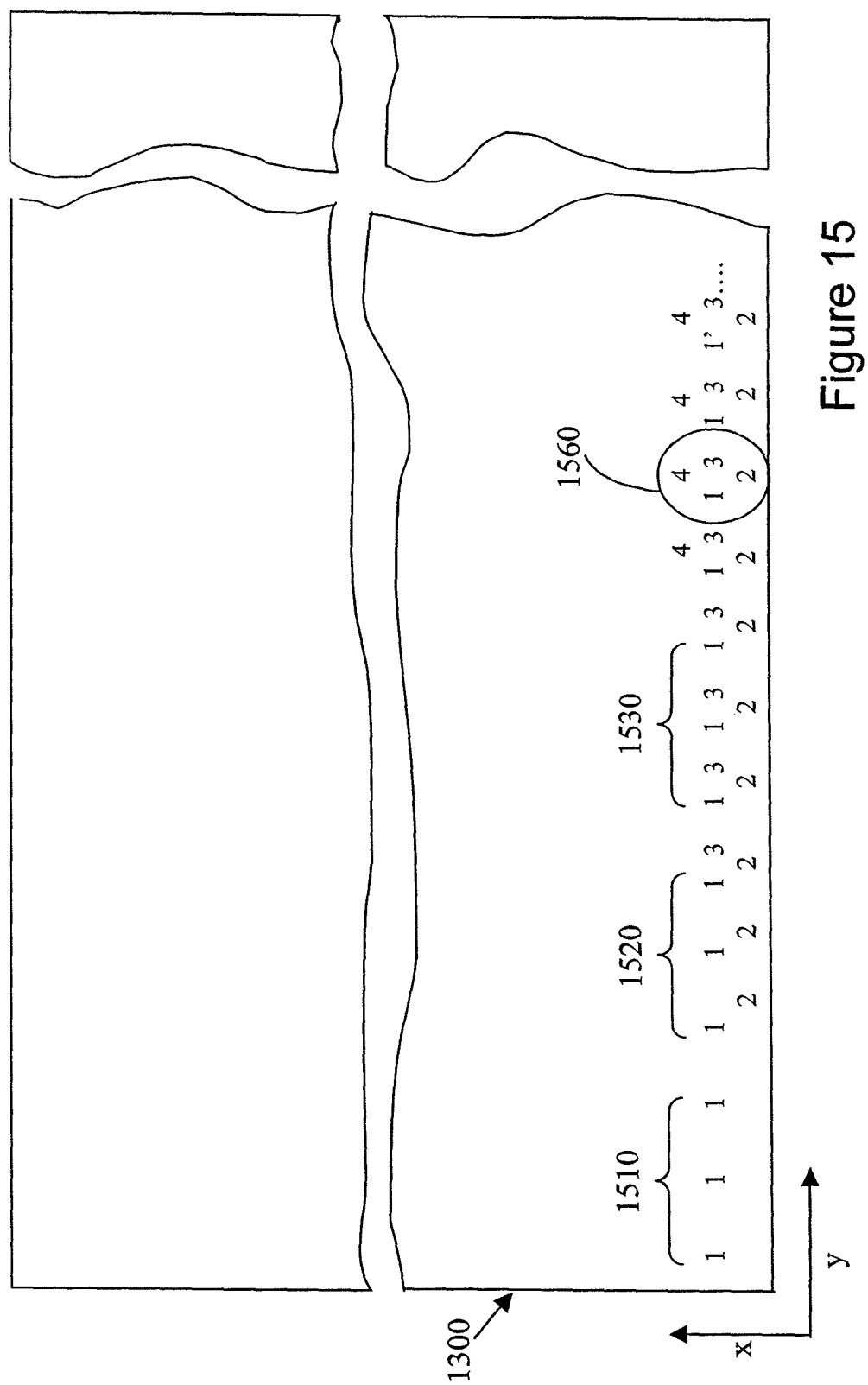
FIG. 15 is a schematic illustration of the sequential irradiation of a film according to one or more embodiments of the present invention using a mask pattern shown in FIG. 13A and a mask translation pattern shown in FIG. 13B.

FIG. 15 illustrates the location of the opaque regions on the film sample after the series of irradiation/translation steps shown in FIG. 14. For the purpose of this example, the method is described with reference to a mask having a 1×12 array of opaque regions, however, it is understood that the mask can include any number and arrangement of opaque regions. For clarity in FIG. 15, the location of the row of opaque regions after each translation/irradiation cycle is denoted by numbers, e.g., the location of the opaque regions during the first irradiation is indicated by number "1"; the location of the opaque regions during the second irradiation is indicated by number "2", and so forth. It will also be appreciated that the translation distances of both the mask and the substrate are a function of the mask dimensions and the laser demagnification.

The mask and sample are positioned for an initial irradiation. The sample is moved continuously in the y-direction a distance 1410, while the mask also is microtranslated a distance 1415 in the x- and y-directions. The sample and mask are moved at a velocity that is calculated to position the sample in the correct location relative to the mask in time for the laser pulse. The illumination pattern is indicated in FIG. 15 by the row of 1's in column 1495. During irradiation, the sample is melted over the entire irradiated area except under the opaque regions of the film. In the cooling that follows, crystal grains grow laterally from the solid front of the opaque regions. After irradiation of the mask at the initial position, the sample moves continuously in the y-direction a distance 1420 at a velocity that is calculated to position the sample in the correct location relative to the mask by the time the laser pulses again. During this time, the mask also is microtranslated a distance 1425 in the x- and y-directions, so that the mask is in position for the next laser pulse. The second irradiation is denoted in FIG. 15 by the row of 2's. In the current embodiment, by way of example only, the time between laser pulses permits the sample to move the distance of three opaque region (indicated by arrow 1510 in FIG. 15), so that the second irradiation pattern is offset by three opaque regions. The sample can, of course, move at any desired rate, and the irradiation pattern can have any desired offset.

The continued translation of the sample along pathway 1430 and the microtranslation of the mask in the x- and y-directions along pathway 1435 positions the sample for the third irradiation, denoted in FIG. 15 by a row of 3's. Note that a further (second) set of three opaque regions (indicated by arrow 1520) is now beyond the irradiation area of the third laser pulse. The continued translation of the sample along pathway 1440 and the microtranslation of the mask in the x- and y-directions along pathway 1445 positions the sample for the fourth irradiation, denoted in FIG. 15 by a row of 4's. Note that a further (third) set of three opaque regions (indicated by arrow 1530) are beyond the irradiation area of the fourth laser pulse, but that a set of three opaque regions were irradiated by all four laser pulses. If full crystallization of the film surface is desired, the mask can be offset as described above for the mask pattern in FIGS. 3-5.

In one or more embodiments of the present invention, the irradiated pattern at position overlaps slightly with adjacent column 1495a, which ensures that the full sample surface is irradiated. The overlap is selected to maximize extent of the film coverage, yet to ensure that the film surface is fully irradiated. The width of the overlap is small, and can be, for example, 0.5 μm, 1 μm, 1.5 μm, or greater.

After four laser pulses, a region of the film exemplified by circle 1560 is completely irradiated. The opaque region designated as "1'" indicates a fifth laser irradiation where the mask has returned to its original position A. Sample translation continues in this manner along path 1420', 1425', 1430', 1435', 1440', 1445', etc. until the sample reaches a predetermined endpoint. In sum, the sample moves with constant velocity in the y-direction, while the mask moves in both the x- and y-directions with the appropriate microtranslations to obtain the desired crystalline film.

Figure 16:
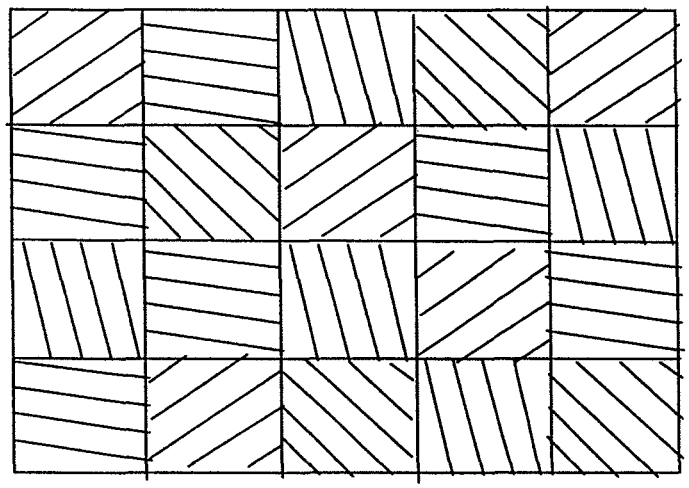
FIG. 16 is an illustration of a crystallized film processed according to one or more embodiments of the present invention using the mask translation of FIGS. 14 and 15.

If the distance between adjacent opaque regions 1320 on mask 1300 is greater than two times the characteristic lateral growth length of the film, then a crystallized structure surrounded by a small-grained polycrystalline precursor film is formed. Note that under some circumstance "complete irradiation" may result in some regions having small polycrystalline grains. As noted above, complete crystallization does not require that the entire film have large grains. It merely requires that the region be crystallized to the extent desired by the process, such that the process does not require the laser to again traverse the same subregion of the film. If the separation distance is less than or equal to the characteristic lateral growth length, then adjacent crystallized structures will form abutting grains and the entire irradiated film forms contiguous large crystalline grains. This structure is illustrated in FIG. 16.

Although various embodiments that incorporate the teachings of the present invention have been shown and described in detail herein, those skilled in the art can readily devise many other varied embodiments that incorporate these teachings.

By way of example only, it is within the scope of the invention to define an irradiation path that traverses only a portion of a substrate. It is also apparent that the choice of (x,y) as the coordinate system is arbitrary; the process can also be conducted using another set of coordinates. The sample can also be translated in the negative-y and positive-x direction during irradiation, or the laser source may be moved during operation to achieve one or more of the directional translations.

What is claimed is:

1. A method of processing a film on a substrate, comprising:
   generating a plurality of laser beam pulses;
   directing the plurality of laser beam pulses through a mask to generate a plurality of patterned laser beams; each of said patterned beams having a length l', a width w' and a spacing between adjacent patterned beams d';
   irradiating a portion of a region of the film with one of the plurality of patterned beams, said beam having an intensity that is sufficient to melt the irradiated portion of the film, wherein the irradiated portion of the film crystallizes upon cooling; and
   repositioning the patterned beam a distance in the y-direction in the range of about $l'/n - \delta$ from the one irradiation pulse to the next, where $\delta$ is a value selected to form overlapping patterned beams; and
   repositioning the patterned beam a distance in the x-direction of about $\lambda'$ over a selected number of irradiation pulses, n, where $\lambda' = w' + d'$.

2. The method of claim 1, wherein advancing the patterned beam comprises moving the film in a constant y-direction and moving the mask in an x-direction.

3. The method of claim 1, wherein n is in the range of 2 to about 25.

4. The method of claim 1, wherein n is 2, the y-translation distance is about $l'/2 - \delta$, and the x-translation distance is about $\lambda'/2$.

5. The method of claim 1, wherein $\delta$ is in the range of about 1-10% of l.

6. The method of claim 2, wherein the movement of the mask in the x-direction oscillates between a positive x-direction and a negative x-direction.

7. The method of claim 6, wherein the mask moves n times in the positive x-direction from an initial x-position, followed by movement in the negative x-direction to the initial x-position.

8. The method of claim 2, wherein the movement of the mask is in a constant x-direction.

9. The method of claim 8, wherein irradiation of the film region forms a column tilted at an angle $\theta$ with respect to the x-axis of translation.

10. The method of claim 9, wherein the substrate is defined by x'- and y'-axes and the x',y'-axes of the substrate are offset from the x,y-axes of translation axis by an angle $\phi$, where $\phi$ is greater than 0° and ranges up to about 45°.

11. The method of claim 10, wherein the tilt angle $\theta$ and the offset angle $\phi$ are substantially the same.

12. The method of claim 2, wherein the mask moves a distance in the x-direction of $\lambda/n$ for each irradiation pulse.

13. The method of claim 1, wherein generating a plurality of laser beam pulses comprises:
   generating a plurality of excimer laser pulses of a predetermined fluence;
   controllably modulating the fluence of the excimer laser pulses; and
   homogenizing the intensity profile of the laser pulse.

14. The method of claim 2, wherein the substrate is defined by x'- and y'-axes and the x',y'-axes of the substrate are offset from the x,y-axes of translation axis by an angle $\phi$, where $\phi$ is greater than 0° and ranges up to about 45°.

15. The method of claim 14, wherein irradiation of the film region forms a column tilted at an angle $\phi$ with respect to the x axis of translation and substantially aligned with the x'- and y' axes of the substrate.

* * * * *